US009865617B2

(12) United States Patent
Han et al.

(10) Patent No.: US 9,865,617 B2
(45) Date of Patent: Jan. 9, 2018

(54) SEMICONDUCTOR DEVICE

(71) Applicants: Hauk Han, Hwaseong-si (KR); Ji Woon Im, Hwaseong-si (KR); Do Hyung Kim, Seongnam-si (KR); Hyun Seok Lim, Suwon-si (KR)

(72) Inventors: Hauk Han, Hwaseong-si (KR); Ji Woon Im, Hwaseong-si (KR); Do Hyung Kim, Seongnam-si (KR); Hyun Seok Lim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 15/402,272

(22) Filed: Jan. 10, 2017

(65) Prior Publication Data

US 2017/0330893 A1    Nov. 16, 2017

(30) Foreign Application Priority Data

May 12, 2016   (KR) .................... 10-2016-0058243

(51) Int. Cl.
| | |
|---|---|
| *H01L 23/528* | (2006.01) |
| *H01L 29/36* | (2006.01) |
| *H01L 27/11582* | (2017.01) |
| *H01L 29/06* | (2006.01) |
| *H01L 23/522* | (2006.01) |
| *H01L 21/306* | (2006.01) |

(52) U.S. Cl.
CPC .. *H01L 27/11582* (2013.01); *H01L 21/30604* (2013.01); *H01L 23/528* (2013.01); *H01L 23/5226* (2013.01); *H01L 29/0649* (2013.01); *H01L 29/36* (2013.01)

(58) Field of Classification Search
CPC .......... H01L 27/11582; H01L 23/5226; H01L 23/528; H01L 29/0649; H01L 29/36
See application file for complete search history.

(56) References Cited

U.S. PATENT DOCUMENTS

| | | | |
|---|---|---|---|
| 6,887,780 B2 * | 5/2005 | Andideh | ........... H01L 21/02126 257/E21.277 |
| 7,923,375 B2 * | 4/2011 | Kikutani | ............. H01L 21/0273 438/514 |
| 8,076,198 B2 | 12/2011 | Lee et al. | |
| 8,197,275 B2 | 6/2012 | Kim | |
| 8,643,084 B2 | 2/2014 | Shin et al. | |
| 8,685,821 B2 | 4/2014 | Eom et al. | |
| 8,748,966 B2 | 6/2014 | Whang et al. | |

(Continued)

FOREIGN PATENT DOCUMENTS

| | | |
|---|---|---|
| JP | 08-195438 | 7/1996 |
| KR | 0161728 B1 | 12/1998 |
| KR | 20000003352 A | 1/2000 |

*Primary Examiner* — Christine Enad
(74) *Attorney, Agent, or Firm* — Volentine & Whitt, PLLC

(57) ABSTRACT

A semiconductor device includes a first interlayer insulating layer and a second interlayer insulating layer, and a horizontal conductive pattern interposed between the first interlayer insulating layer and the second interlayer insulating layer. Vertical structures extend through the first interlayer insulating layer, the second interlayer insulating layer, and the horizontal conductive pattern. Each of the first interlayer insulating layer and the second interlayer insulating layer has regions of different impurity concentrations.

19 Claims, 23 Drawing Sheets

(56) References Cited

U.S. PATENT DOCUMENTS

| | | | |
|---|---|---|---|
| 8,802,525 B2 | 8/2014 | Schrinsky et al. | |
| 8,912,591 B2 | 12/2014 | Baek et al. | |
| 9,117,848 B2 | 8/2015 | Kusai et al. | |
| 2003/0008499 A1* | 1/2003 | Kobayashi | H01L 21/26586 438/637 |
| 2011/0306195 A1 | 12/2011 | Kim et al. | |
| 2012/0012920 A1* | 1/2012 | Shin | H01L 27/11578 257/324 |
| 2014/0004676 A1* | 1/2014 | Eom | H01L 29/7926 438/287 |
| 2015/0041879 A1* | 2/2015 | Jayanti | H01L 21/28282 257/324 |
| 2015/0104916 A1* | 4/2015 | Lee | H01L 27/1157 438/268 |

* cited by examiner

SEMICONDUCTOR DEVICE

PRIORITY STATEMENT

This application claims benefit of priority to Korean Patent Application No. 10-2016-0058243 filed on May 12, 2016 in the Korean Intellectual Property Office, the disclosure of which is incorporated herein by reference in its entirety.

BACKGROUND

1. Field

The present inventive concept relates to a semiconductor device and to a method of forming the same.

2. Description of Related Art

In electronic products, the degree of integration of semiconductor devices, such as flash memory devices, is one of several critical factors determining the final price of the electronic products. In order to increase the degree of integration of semiconductor devices, three-dimensional semiconductor devices including three-dimensionally arrayed memory cells have been proposed. As the size of components of three-dimensional semiconductor devices has been gradually reduced to increase the degree of integration of three-dimensional semiconductor devices, the defect rate thereof has gradually increased.

SUMMARY

According to an aspect of the present inventive concept, there is provided a semiconductor device which includes a first interlayer insulating layer and a second interlayer insulating layer, a horizontal conductive pattern interposed between the first interlayer insulating layer and the second interlayer insulating layer, and vertical structures each extending vertically through the first interlayer insulating layer, the second interlayer insulating layer, and the horizontal conductive pattern, and wherein each of the first interlayer insulating layer and the second interlayer insulating layer includes regions having different impurity concentrations.

According to another aspect of the present inventive concept, there is provided a semiconductor device which includes interlayer insulating layers and horizontal conductive patterns alternately stacked on a substrate, vertical structures extending through the interlayer insulating layers and the horizontal conductive patterns, and data storage layers disposed between the vertical structures and the horizontal conductive patterns, and wherein each of the interlayer insulating layers has a first side surface and a second side surface facing in opposite directions with respect to each other, wherein each of the interlayer insulating layers has first regions disposed adjacent to the first side surface and the second side surface thereof, respectively, and a second region disposed between the first regions, a portion of the second region is thicker than the first regions, and wherein the first regions have an impurity concentration higher than that of the portion of the second region that is thicker than the first regions.

According to still another aspect of the present inventive concept, there is provided a semiconductor device which includes a substrate, separation patterns disposed on the substrate and comprising insulating material, a stack of horizontal layers disposed on the substrate and interposed between the insulating material of the separation patterns, and vertical structures comprising semiconductor material extending through the stack of horizontal layers, and wherein the horizontal layers include interlayer insulating layers and conductive lines alternately disposed in a vertical direction in the stack such that each of the conductive lines is interposed between vertically adjacent ones of a respective pair of the interlayer insulating layers, wherein each of the conductive lines has a thickness, in the vertical direction, that varies in a widthwise direction of the conductive line between the separation patterns, wherein each of the conductive lines is thinnest at a central portion thereof intermediate the separation patterns in the widthwise direction, wherein each of the interlayer insulating layers has first regions disposed adjacent to the separation patterns, respectively, and a second region intermediate the first regions, wherein the first regions have a thickness, in the vertical direction, that is less than a thickness of the second regions in the vertical direction. Also, the first regions and the second region have etch rates when exposed in common to a given etchant wherein the etch rate of material constituting the first regions is greater than that of material constituting the second region.

BRIEF DESCRIPTION OF DRAWINGS

The above and other aspects, features and other advantages of the present inventive concept will be more clearly understood from the following detailed description taken in conjunction with the accompanying drawings, in which.

DETAILED DESCRIPTION

Figure 1:
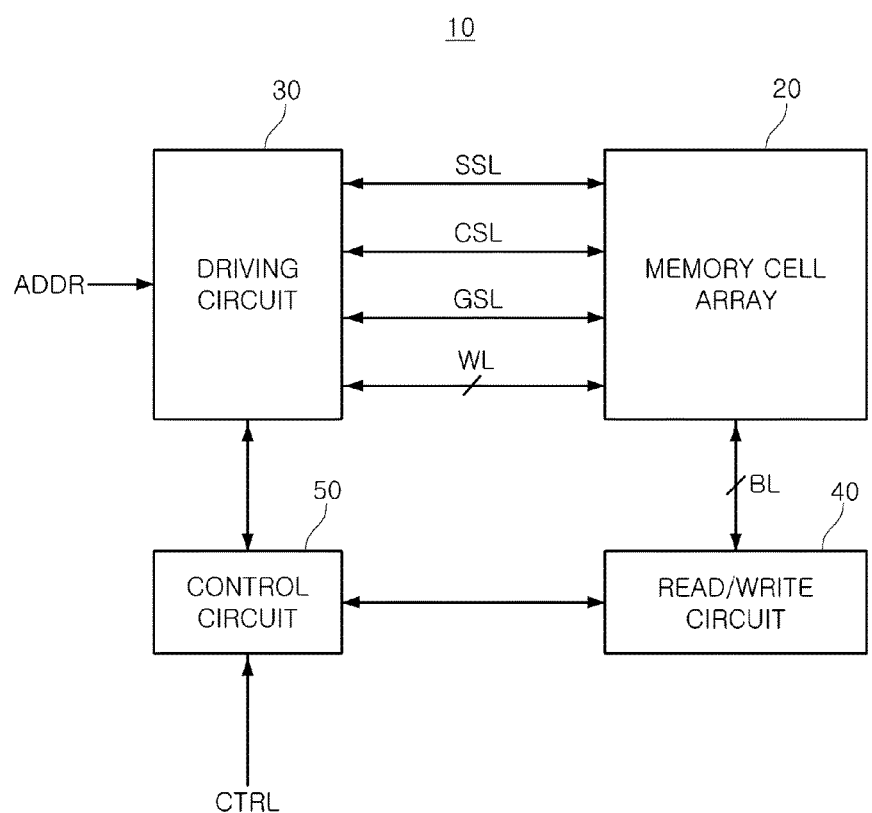
FIG. 1 is a schematic block diagram of examples of a semiconductor device according to the present inventive concept.

FIG. 1 is a schematic block diagram of examples of a semiconductor device according to the present inventive concept.

With reference to FIG. 1, a semiconductor device 10 may include a memory cell array 20, a driving circuit 30, a read/write circuit 40, and a control circuit 50.

The memory cell array 20 may include a plurality of memory cells arrayed in a plurality of rows and columns. The plurality of memory cells of the memory cell array 20 may be connected to the driving circuit 30 through word lines (WL), a common source line (CSL), a string select line (SSL), a ground select line (GSL), or the like, and may be connected to the read/write circuit 40 through bit lines (BL).

In examples, the plurality of memory cells arrayed in the same row may be connected to the same WL, while the plurality of memory cells arrayed in the same column may be connected to the same BL.

The plurality of memory cells of the memory cell array 20 may be classified into a plurality of memory blocks. Respective memory blocks may include a plurality of WLs, a plurality of SSLs, a plurality of GSLs, a plurality of BLs, and at least one CSL.

The driving circuit 30 and the read/write circuit 40 may be operated by the control circuit 50.

According to an example, the driving circuit 30 may receive address information from an external source to decode received address information, thus selecting at least one portion of the WL, the CSL, the SSL, and the GSL, connected to the memory cell array. The driving circuit 30 may include a driving circuit of each of the WL, the SSL, and the CSL.

The read/write circuit 40 may select at least one portion of the BLs connected to the memory cell array 20 according to a command received by the control circuit 50. The read/write circuit 40 may read data stored in a memory cell connected to at least one selected portion of the BLs or may record data in the memory cell connected to the at least one selected portion of the BLs. In order to perform operations as described above, the read/write circuit 40 may include a circuit, such as a page buffer, an input/output buffer, a data latch, etc.

The control circuit 50 may control an operation of the driving circuit 30 and the read/write circuit 40 in response to a control signal CTRL transmitted from the external source. In a case in which data stored in the memory cell array 20 is read, the control circuit 50 may control the operation of the driving circuit 30 to allow a voltage required for a read operation to be supplied to the WL storing data to read. In a case in which the voltage required for a read operation is supplied to a specific WL, the control circuit 50 may control to allow the read/write circuit 40 to read data stored in the memory cell connected to the WL receiving the voltage required for a read operation.

In the meantime, in a case in which data is written to the memory cell array 20, the control circuit 50 may control the operation of the driving circuit 30 to allow a voltage required for a write operation to be supplied to the WL to write data. In a case in which the voltage required for a write operation is supplied to a specific WL, the control circuit 50 may control the read/write circuit 40 to allow data to be written in the memory cell connected to the WL receiving the voltage required for a write operation.

Figure 2:
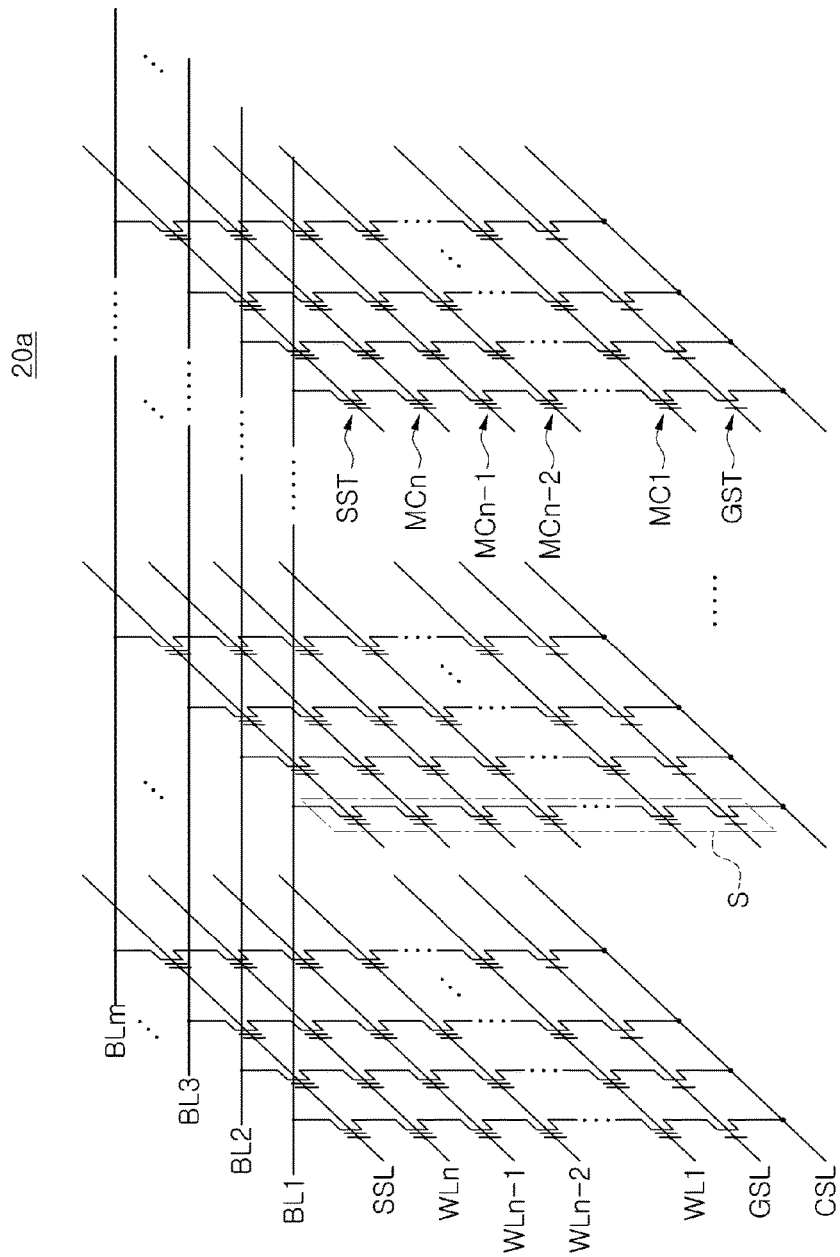
FIG. 2 is an exemplary equivalent circuit diagram of a memory cell array of examples of a semiconductor device according to the present inventive concept.

FIG. 2 is an equivalent circuit diagram illustrating an example of a three-dimensional structure of a memory cell array 20a of the semiconductor device 10.

With reference to FIG. 2, the memory cell array 20a may include n memory cell devices MC1 to MCn connected in series, a ground select transistor (GST) connected to opposing ends of the memory cell devices MC1 to MCn in series, and a plurality of memory cell strings including a string select transistor (SST).

The n memory cell devices MC1 to MCn connected in series may be connected to WLs WL1 to WLn, respectively, to select at least one portion of the memory cell devices MC1 to MCn.

A gate terminal of the GST may be connected to the GSL, while a source terminal may be connected to the CSL. In the meantime, a gate terminal of the SST may be connected to the SSL, while the source terminal may be connected to a drain terminal of the memory cell device MCn. FIG. 2 illustrates a structure in which a single GST and a single SST are connected to n memory cell devices MC1 to MCn connected in series. Alternatively, however, a plurality of GSTs or a plurality of SSTs may be connected thereto.

A drain terminal of the SST may be connected to BLs BL1 to BLm. In a case in which a signal is applied to the gate terminal of the SST through the SSL, a signal applied through the BLs BL1 to BLm may be transmitted to n memory cell devices MC1 to MCn connected in series, so that a data read operation or a data write operation may be undertaken. In addition, a signal may be applied to the gate terminal of the GST through the GSL, and thus an erase operation to remove an entirety of electric charges stored in n memory cell devices MC1 to MCn may be undertaken.

Figure 3:
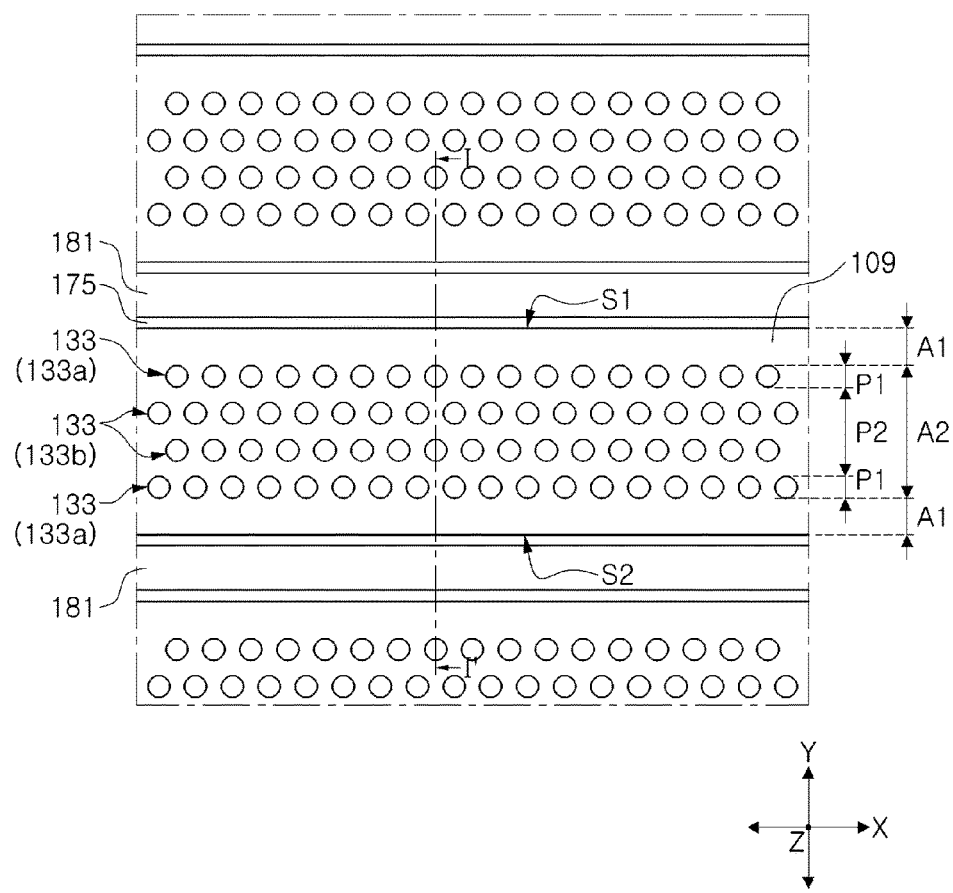
FIG. 3 is a plan view of a portion of a semiconductor device according to the present inventive concept.
Figure 4:
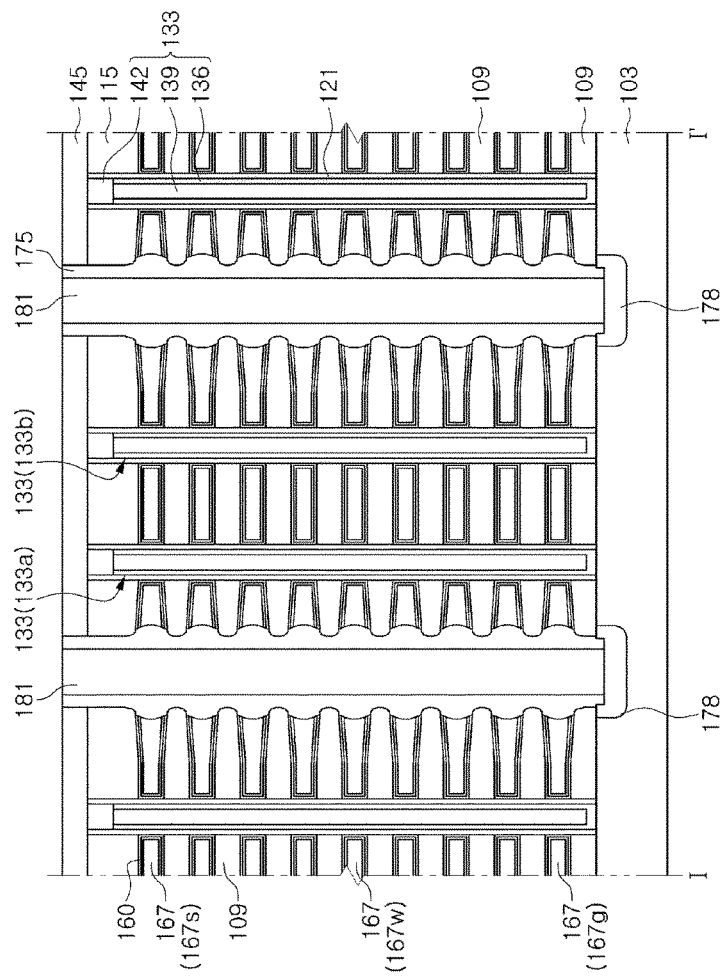
FIG. 4 is a cross-sectional view taken along line I-I' of FIG. 3.

With reference to FIGS. 3 and 4, an example of a semiconductor device according to the present inventive concept will be described. FIG. 3 is a plan view of a portion of the semiconductor device, while FIG. 4 is a cross-sectional view taken along line I-I' of FIG. 3.

Horizontal interlayer insulating layers 109 and horizontal conductive patterns 167 may be disposed on a substrate 103 as alternately stacked in a direction (Z direction) perpendicular to a surface of the substrate 103. The substrate 103 may be a semiconductor substrate including a semiconductor material, such as silicon (Si) or the like.

The interlayer insulating layers 109 may have a line shape extending in a first direction (X direction), and may each include a first side surface S1 and a second side surface S2, facing in opposite directions. The term "extending", as used here and throughout the specification and as the drawings make clear, will be understood in most instances as referring to a lengthwise or longitudinal dimension of a particular feature or element, especially in the case of a line-shaped feature or element. In the case of a columnar feature or element, the term "extending" will be understood as referring to an axial direction of the particular feature or element. In any case, the interlayer insulating layers 109 may include first regions A1 constituting the first side surface S1 and the second side surface S2, and may include a second region A2 disposed between the first regions A1.

The interlayer insulating layers 109 may have a width greater than that of the horizontal conductive patterns 167. The first side surface S1 and the second side surface S2 of the interlayer insulating layers 109 may be convex, while the horizontal conductive patterns 167 may include concave side surfaces.

A horizontal conductive pattern 167g constituting the bottommost one of the horizontal conductive patterns 167 may be provided as the GSL shown in and described with reference to FIG. 2, while a horizontal conductive pattern 167s constituting the uppermost one of the horizontal conductive patterns 167 may be provided as the SSL shown in and described with reference to FIG. 2. In addition, a plurality of horizontal conductive patterns 167w disposed between the horizontal conductive pattern 167g and the horizontal conductive pattern 167s may be provided as the WLs WL1 to WLn shown in and described with reference to FIG. 2.

An uppermost interlayer insulating layer 115 may be disposed on the uppermost horizontal conductive pattern 167s. The uppermost interlayer insulating layer 115 may be of the same material as the interlayer insulating layers 109.

Vertical structures 133 extending through the uppermost interlayer insulating layer 115, the horizontal conductive patterns 167, and the interlayer insulating layers 109 may be formed.

The vertical structures 133 may extend through the second region A2 of the interlayer insulating layers 109. The vertical structures 133 may include external vertical structures 133a (e.g., laterally outermost rows of the vertical structures 133) disposed adjacent to the first side surface S1 and the second side surface S2 of the interlayer insulating layers 109, and may include internal vertical structures 133b disposed further from the first side surface S1 and the second side surface S2 than are the external vertical structures 133a (e.g., between the laterally outermost rows of the vertical structures 133).

Each of the vertical structures 133 may include a core pattern 139, a semiconductor layer 136 covering a bottom surface and a side surface of the core pattern 139, and a pad pattern 142 on the core pattern 139.

In an example, the core pattern 139 may include an insulating material, such as silicon oxide or the like. The semiconductor layer 136 may include a semiconductor material, such as Si or the like.

In an example, the pad pattern 142 may include the insulating material, such as doped polysilicon or the like. For example, the pad pattern 142 may be formed to have n-type conductivity. The pad pattern 142 may be provided as a drain terminal of the SST shown in and described with reference to FIG. 2.

A gate dielectric structure including a data storage layer may be disposed between the vertical structures 133 and the horizontal conductive patterns 167.

In an example, the gate dielectric structure may include a first dielectric structure 121 and a second dielectric structure 160. One of the first dielectric structure 121 and the second dielectric structure 160 may include the data storage layer.

In an example, the first dielectric structure 121 may be interposed between the second dielectric structure 160 and the vertical structures 133 as extending between the interlayer insulating layers 109 and the vertical structures 133. The second dielectric structure 160 may be interposed between the first dielectric structure 121 and the horizontal conductive patterns 167w as extending between the horizontal conductive patterns 167w and the interlayer insulating layers 109.

An uppermost insulating layer 145 covering the vertical structures 133 and the uppermost interlayer insulating layer 115 may be provided.

Separation patterns 181 may be disposed as spaced apart from each other on the substrate 103. The separation patterns 181 may extend through the uppermost insulating layer 145, the uppermost interlayer insulating layer 115, the interlayer insulating layers 109, and the horizontal conductive patterns 167. The separation patterns 181 may have a line shape extending in the first direction (X direction) in a plan view. The interlayer insulating layers 109 and the horizontal conductive patterns 167 may be disposed between the separation patterns 181.

In an example, the separation patterns 181 may include a conductive material. For example, the separation patterns 181 may include a metallic nitride (for example, titanium nitride (TiN), tantalum nitride (TaN), or the like) and/or a metal (for example, titanium (Ti), tungsten (W), or the like).

Insulating spacers 175 may be disposed on a side surface of the separation patterns 181. The insulating spacers 175 may include an insulating material, such as silicon oxide. The insulating spacers 175 may be interposed between the separation patterns 181 and the horizontal conductive patterns 167w, and may be interposed between the separation patterns 181 and the interlayer insulating layers 109.

Source impurity regions 178 may be disposed in the substrate 103 adjacent a lower portion of the separation patterns 181. The source impurity regions 178 may have n-type conductivity, while a portion of the substrate 103 disposed adjacent to the source impurity regions 178 may have p-type conductivity. The source impurity regions 178 may be provided as the CSL shown in and described with reference to FIG. 2.

The interlayer insulating layers 109 may include silicon oxide or a silicon oxide-based material. The silicon oxide-based material may be provided as silicon oxide including carbon (C).

Each of the interlayer insulating layers 109 may include regions having different compositions such as by being formed of the same materials but having impurities introduced therein at different concentrations. For example, at least a portion the second region A2 of the interlayer insulating layers 109 may have an impurity concentration lower than that of the first regions A1 of the interlayer insulating layers 109.

The impurity in the main body of the material of the interlayer insulating layers 109 may be an element that affects the etching rate of the interlayer insulating layers 109, i.e., that causes the etching rate of the interlayer insulating layers to be different from that of the main body of the material of the interlayer insulating layers 109. Also, the etching rate of the interlayer insulating layers 109 may depend on the impurity concentration of the interlayer insulating layers 109. For example, the first regions A1 and the second region A2 have etch rates when exposed in common to a given etchant wherein the rate at which material constituting the first regions are etched when exposed to the etchant is greater than the etch rate of material constituting the second region when exposed to the etchant.

In an example, the impurity of the interlayer insulating layers 109 may include one of phosphorous (P) and boron (B), but the present inventive concept is not limited thereto. For example, the impurity of the interlayer insulating layers 109 may include nitrogen (N), hydrogen (H), chlorine (Cl), fluoride (F), or sulfur (S).

In an example, in the regions of the interlayer insulating layers 109, having different impurity concentrations, a region having a relatively high impurity concentration may have an etching rate different from that of a region having a relatively low impurity concentration. For example, in the interlayer insulating layers 109, an etching rate of the region having the relatively high impurity concentration may be different from that of the region having the relatively low impurity concentration. In the interlayer insulating layers 109, the etching rate of the region having the relatively high impurity concentration may be higher than that of the region having the relatively low impurity concentration. For example, a portion of the second region A2, having the impurity concentration lower than that of the first regions A1 may have an etching rate lower than that of the first regions A1. In these examples, the "etching rates" of the different regions of course refers to the etching rates that result when the regions are exposed in common to the same etchant.

In an example, in the regions of the interlayer insulating layers 109, having different impurity concentrations, the region having the relatively high impurity concentration may be thinner than the region having the relatively low impurity concentration. The portion of the second region A2, having the impurity concentration lower than that of the first regions A1 may be thicker than the first regions A1.

In an example, the uppermost interlayer insulating layer 115 disposed adjacent to the horizontal conductive patterns 167 may be formed of the same material as and to have the same impurity concentration as the interlayer insulating layers 109. For example, in the same manner as the interlayer insulating layers 109, the uppermost interlayer insulating layer 115 may include a region having the relatively high impurity concentration and a region having the relatively low impurity concentration, and may include a thick region and a thin region.

In an example, regions of the horizontal conductive patterns 167 interposed between the first regions A1 of the interlayer insulating layers 109 may have the impurity concentration lower than that of the first regions A1, and may be formed to be thicker than the regions of the horizontal conductive patterns 167 interposed between regions of the second region A2 of the interlayer insulating layers 109.

The second region A2 of the interlayer insulating layers 109 may include first portions P1 disposed between the external vertical structures 133*a*, and may include a second portion P2 disposed between the first portions P1. The internal vertical structures 133*b* may extend through the second portion P2 of the interlayer insulating layers 109.

In an example, impurity concentrations in the portions of the interlayer insulating layers 109, disposed adjacent to the internal vertical structures 133*b*, may be lower than those of the portions of the interlayer insulating layers 109 disposed adjacent to the first side surface S1 and the second side surface S2 of the interlayer insulating layers 109.

As described above, the interlayer insulating layers 109 may include regions having different impurity concentrations, and may include regions having different thicknesses. In addition, the horizontal conductive patterns 167 may include the regions having different thicknesses.

A process of forming the semiconductor device using the interlayer insulating layers 109 including the regions having different impurity concentrations may allow a defect rate to be reduced, and a decrease in the defect rate may lead to a yield and productivity being increased.

The interlayer insulating layers 109 may prevent a process defect from occurring. In addition, electrical properties of the horizontal conductive patterns 167 having a relatively thick portion disposed adjacent to the separation patterns 181 may be improved. Therefore, the electrical properties of the semiconductor device may be improved.

Examples of the interlayer insulating layers 109 and the horizontal conductive patterns 167 will be described with reference to FIGS. 5A to 10B. In this case, in order to facilitate understanding, descriptions of a first interlayer insulating layer and a second interlayer insulating layer, disposed adjacent to each other as vertically spaced apart from each other, and of a first horizontal conductive pattern interposed between the first interlayer insulating layer and the second interlayer insulating layer will be provided. Detailed descriptions of the first region A1, the second region A2, the first portion P1, and the second portion P2 of the interlayer insulating layers 109, the vertical structures 133, a first dielectric structure 121, and a second dielectric structure 160, as illustrated with reference to FIGS. 3 and 4, will be omitted.

FIGS. 5A, 6A, 7A, 8A, 9A, and 10A are cross-sectional views illustrating examples of the first interlayer insulating layer and the second interlayer insulating layer, disposed adjacent to each other and the first conductive pattern interposed between the first interlayer insulating layer and the second interlayer insulating layer.

Figure 5A:
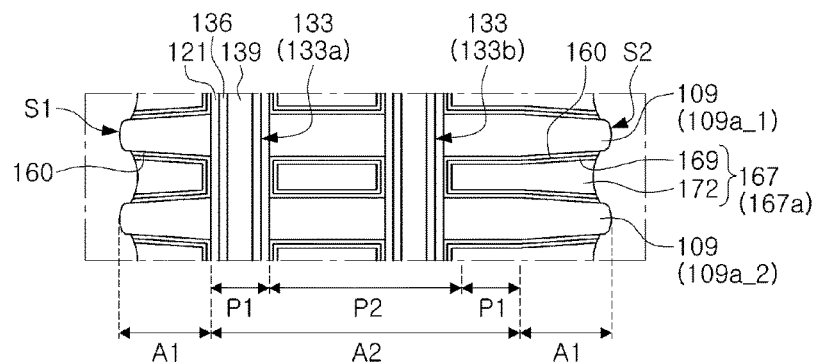
FIGS. 5A, 6A, 7A, 8A, 9A, and 10A are cross-sectional views of portions of semiconductor devices according to the present inventive concept.
Figure 5B:
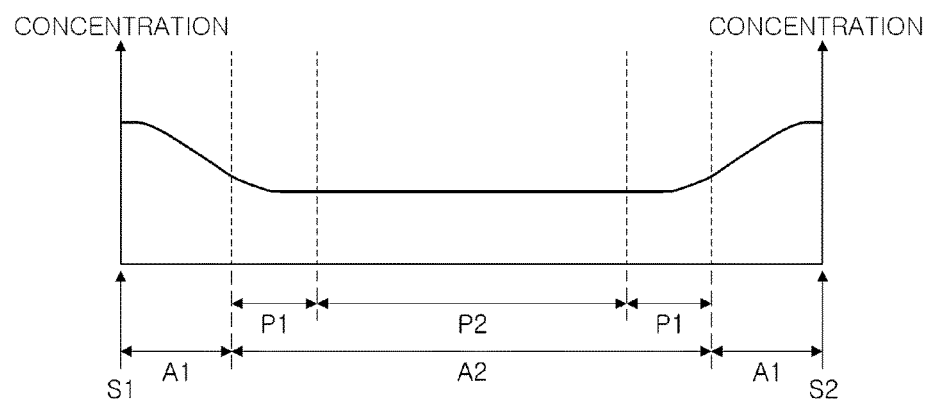
FIGS. 5B, 6B, 7B, 8B, 9B, and 10B are graphs respectively illustrating impurity concentrations in the portions of the semiconductor devices illustrated in FIGS. 5A, 6A, 7A, 8A, 9A, and 10A, respectively.

FIG. 5B is a graph illustrating an exemplary impurity concentration of the interlayer insulating layers 109 in FIG. 5A; FIG. 6B is a graph illustrating the exemplary impurity concentration of the interlayer insulating layers 109 in FIG. 6A; FIG. 7B is a graph illustrating the exemplary impurity concentration of the interlayer insulating layers 109 in FIG. 7A; FIG. 8B is a graph illustrating the exemplary impurity concentration of the interlayer insulating layers 109 in FIG. 8A; FIG. 9B is a graph illustrating the exemplary impurity concentration of the interlayer insulating layers 109 in FIG. 9A; and FIG. 10B is a graph illustrating the exemplary impurity concentration of the interlayer insulating layers 109 in FIG. 10A.

In FIGS. 5A, 6A, 7A, 8A, 9A, and 10A, the interlayer insulating layers 109 may each have the same contiguous form as illustrated in the plan view in FIG. 3. Therefore, FIGS. 5B, 6B, 7B, 8B, 9B, and 10B may represent the impurity concentration of the interlayer insulating layers 109 between the first and second side surfaces S1 and S2 thereof.

First, with reference to FIGS. 5A and 5B along with FIGS. 3 and 4, an example of the interlayer insulating layers 109 and the horizontal conductive patterns 167 will be described.

With reference to FIGS. 5A and 5B along with FIGS. 3 and 4, the interlayer insulating layers 109 may include a first interlayer insulating layer 109*a*_1 and a second interlayer insulating layer 109*a*_2, disposed adjacent to each other as vertically spaced apart from each other. In addition, a single horizontal conductive pattern 167*a* may be interposed between the first interlayer insulating layer 109*a*_1 and the second interlayer insulating layer 109*a*_2.

In the first interlayer insulating layer 109*a*_1 and the second interlayer insulating layer 109*a*_2, the impurity concentration may be gradually reduced in a direction from the first side surface S1 and the second side surface S2 toward the first portions P1 in the second region A2. The first interlayer insulating layer 109*a*_1 and the second interlayer insulating layer 109*a*_2 may become gradually thicker in the direction from the first side surface S1 and the second side surface S2 toward the first portions P1 in the second region A2.

In the first interlayer insulating layer 109*a*_1 and the second interlayer insulating layer 109*a*_2, the impurity concentration of the second portion P2 of the second region A2 may be lower than that of the first regions A1. In the first interlayer insulating layer 109*a*_1 and the second interlayer insulating layer 109*a*_2, the first regions A1 having a relatively high impurity concentration may be thinner than the second portion P2 of the second region A2, having a relatively low impurity concentration.

The thickness of the horizontal conductive pattern 167*a* may gradually decrease in a direction from a region of overlap between the horizontal conductive pattern 167*a* and the first regions A1 of the first interlayer insulating layer 109*a*_1 and the second interlayer insulating layer 109*a*_2 toward a region of overlap between the horizontal conductive pattern 167*a* and the first portions P1 of the second region A2 of the first interlayer insulating layer 109*a*_1 and the second interlayer insulating layer 109*a*_2. Here, the term "overlap" means vertically juxtaposed and does not imply that one region extends over and laterally of another.

The thickness of the horizontal conductive pattern 167*a* at the region thereof adjacent to the first side surface S1 and the second side surface S2 of the first interlayer insulating layer 109*a*_1 and the second interlayer insulating layer 109*a*_2 may be greater than that of the thickness of the first horizontal conductive pattern at a region thereof overlapping the second portion P2 of the second region A2 of the first interlayer insulating layer 109*a*_1 and the second interlayer insulating layer 109*a*_2.

Figure 6A:
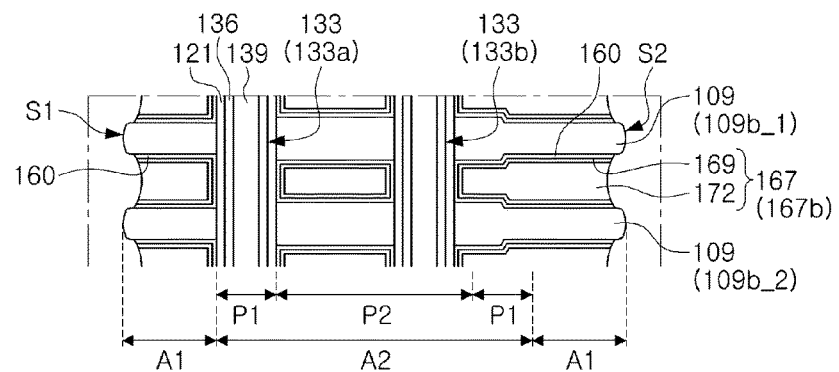
Figure 6B:
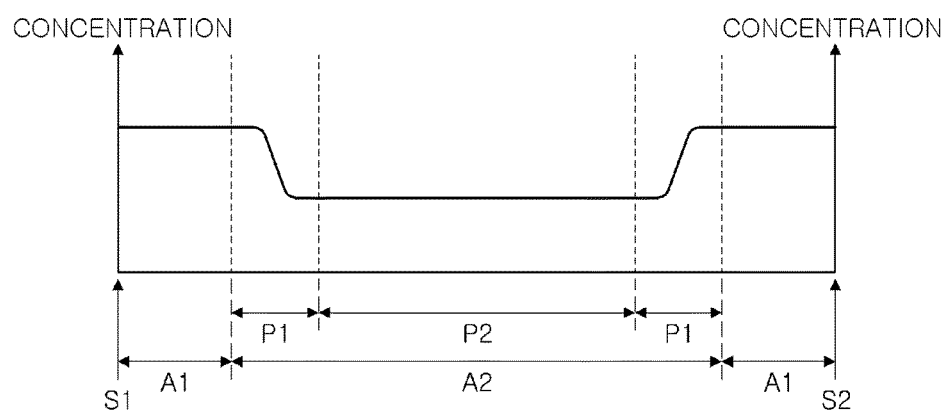

With reference to FIGS. 6A and 6B along with FIGS. 3 and 4, the interlayer insulating layers 109 may include a first interlayer insulating layer 109*b*_1 and a second interlayer insulating layer 109*b*_2, disposed adjacent to each other as vertically spaced apart from each other. In addition, a single horizontal conductive pattern 167*b* may be interposed between the first interlayer insulating layer 109*b*_1 and the second interlayer insulating layer 109*b*_2.

In the first interlayer insulating layer 109*b*_1 and the second interlayer insulating layer 109*b*_2, impurity concentrations in the first regions A1 may be higher than that of the second portion P2 of the second region A2.

In the first interlayer insulating layer 109*b*_1 and the second interlayer insulating layer 109*b*_2, impurity concentrations in the first regions A1 may be substantially uniform, while the impurity concentration of the second portion P2 of the second region A2 may be substantially uniform. A substantial change in impurity concentrations in the first interlayer insulating layer 109*b*_1 and the second interlayer insulating layer 109*b*_2 may occur in the first portions P1 of the second region A2 of the first interlayer insulating layer 109*b*_1 and the second interlayer insulating layer 109*b*_2.

In the first interlayer insulating layer 109*b*_1 and the second interlayer insulating layer 109*b*_2, the impurity concentration of the second portion P2 of the second region A2 may be lower than that of the first regions A1, and the second portion P2 may be thicker than the first regions A1. A step caused by a change in thickness of the first interlayer insulating layer 109*b*_1 and the second interlayer insulating layer 109*b*_2 may occur in the first portions P1 of the second region A2.

A thickness of a region of overlap between the horizontal conductive pattern 167*b* and the first regions A1 of the first interlayer insulating layer 109*b*_1 and the second interlayer insulating layer 109*b*_2 may be greater than that of a region of overlap between the horizontal conductive pattern 167*b* and the second portion P2 of the second region A2 of the first interlayer insulating layer 109*b*_1 and the second interlayer insulating layer 109*b*_2. The step caused by the change in thickness may occur in a region of overlap between the horizontal conductive pattern 167*b* and the first portions P1 of the second region A2 of the first interlayer insulating layer 109*b*_1 and the second interlayer insulating layer 109*b*_2.

Figure 7A:
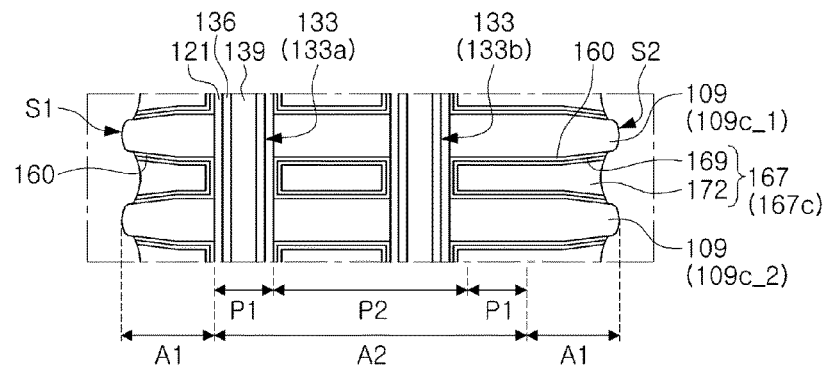
Figure 7B:
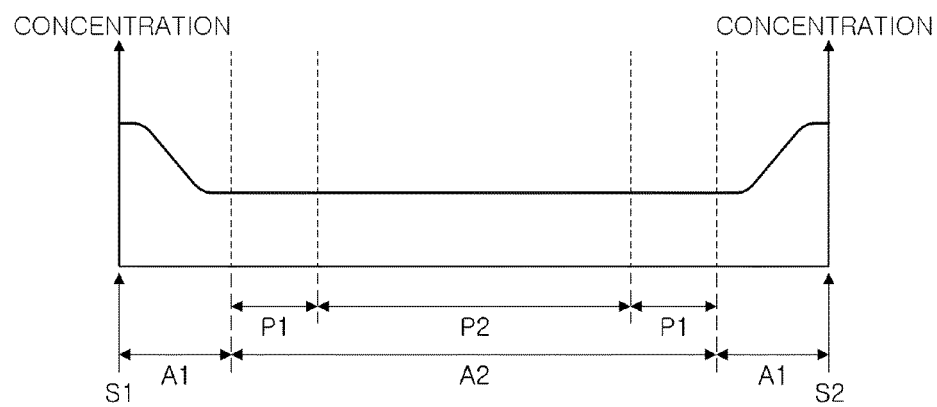

With reference to FIGS. 7A and 7B along with FIGS. 3 and 4, the interlayer insulating layers 109 may include a first interlayer insulating layer 109*c*_1 and a second interlayer insulating layer 109*c*_2, disposed adjacent to each other as vertically spaced apart from each other. In addition, a single horizontal conductive pattern 167*c* may be interposed between the first interlayer insulating layer 109*c*_1 and the second interlayer insulating layer 109*c*_2.

In the first regions A1 of the first interlayer insulating layer 109*c*_1 and the second interlayer insulating layer 109*c*_2, the impurity concentration may gradually decrease in a direction away from the first side surface S1 and the second side surface S2. In the first regions A1 of the first interlayer insulating layer 109*c*_1 and the second interlayer insulating layer 109*c*_2, the thickness of each interlayer insulating layer may gradually decrease in a direction away from the first side surface S1 and the second side surface S2.

In the first interlayer insulating layer 109*c*_1 and the second interlayer insulating layer 109*c*_2, the impurity concentration of the second region A2 may be lower than that of the first regions A1 disposed adjacent to the first side surface S1 and the second side surface S2. In the first interlayer insulating layer 109*c*_1 and the second interlayer insulating layer 109*c*_2, the thickness of the second region A2 may be greater than that of the first regions A1 disposed adjacent to the first side surface S1 and the second side surface S2.

In a region of overlap between the horizontal conductive pattern 167*c* and the first regions A1 of the first interlayer insulating layer 109*c*_1 and the second interlayer insulating layer 109*c*_2, the thickness may gradually decrease in directions away from the side surface S1 and the second side surface S2 of the first interlayer insulating layer 109*c*_1 and the second interlayer insulating layer 109*c*_2.

A thickness of a portion of the horizontal conductive pattern 167*c* overlapping the second region A2 of the first interlayer insulating layer 109*c*_1 and the second interlayer insulating layer 109*c*_2 may be substantially uniform, and may be less than that of a portion of the horizontal conductive pattern 167*c* disposed adjacent to the first side surface S1 and the second side surface S2 of the first interlayer insulating layer 109*c*_1 and the second interlayer insulating layer 109*c*_2.

Figure 8A:
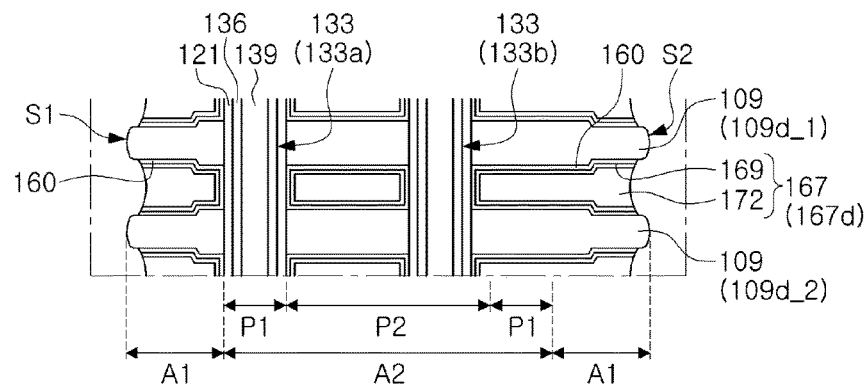
Figure 8B:
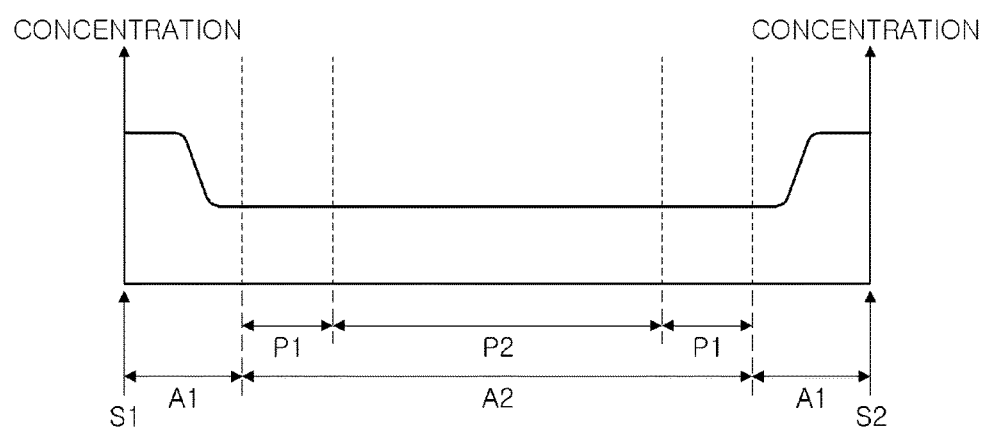

With reference to FIGS. 8A and 8B along with FIGS. 3 and 4, the interlayer insulating layers 109 may include a first interlayer insulating layer 109*d*_1 and a second interlayer insulating layer 109*d*_2, disposed adjacent to each other as vertically spaced apart from each other. In addition, a single horizontal conductive pattern 167*d* may be interposed between the first interlayer insulating layer 109*d*_1 and the second interlayer insulating layer 109*d*_2.

The first regions A1 of the first interlayer insulating layer 109*d*_1 and the second interlayer insulating layer 109*d*_2 may include a region having the relatively high impurity concentration and a region having the relatively low impurity concentration. In the first regions A1 of the first interlayer insulating layer 109*d*_1 and the second interlayer insulating layer 109*d*_2, a portion disposed adjacent to the first side surface S1 and the second side surface S2 may have the relatively high impurity concentration, while a portion disposed relatively distantly from the first side surface S1 and the second side surface S2 may have the relatively low impurity concentration.

In the first regions A1 of the first interlayer insulating layer 109*d*_1 and the second interlayer insulating layer 109*d*_2, the portion having the relatively high impurity concentration may be relatively thin, while the portion having the relatively low impurity concentration may be relatively thick. In the first regions A1 of the first interlayer insulating layer 109d_1 and the second interlayer insulating layer 109d_2, the step caused by the change in thickness may occur.

In a region of overlap between the horizontal conductive pattern 167d and the first regions A1 of the first interlayer insulating layer 109d_1 and the second interlayer insulating layer 109d_2, the step caused by a thick portion and a thin portion may occur. A thickness of a portion of the horizontal conductive pattern 167d overlapping the second region A2 of the first interlayer insulating layer 109d_1 and the second interlayer insulating layer 109d_2 may be substantially uniform, and may be less than that of a portion of the horizontal conductive pattern 167d disposed adjacent to the first side surface S1 and the second side surface S2 of the first interlayer insulating layer 109d_1 and the second interlayer insulating layer 109d_2.

Figure 9A:
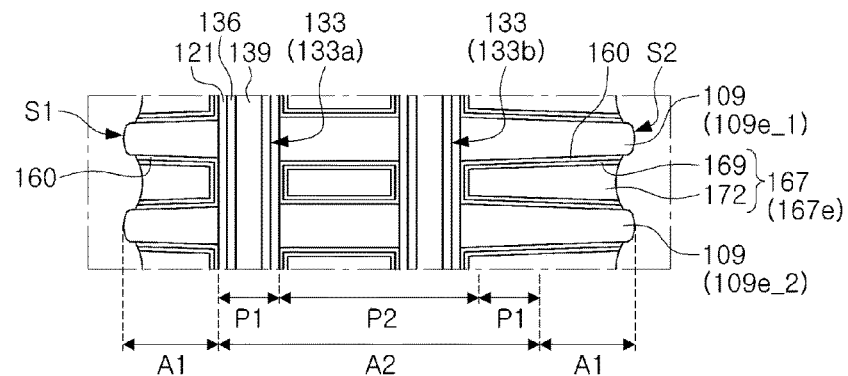
Figure 9B:
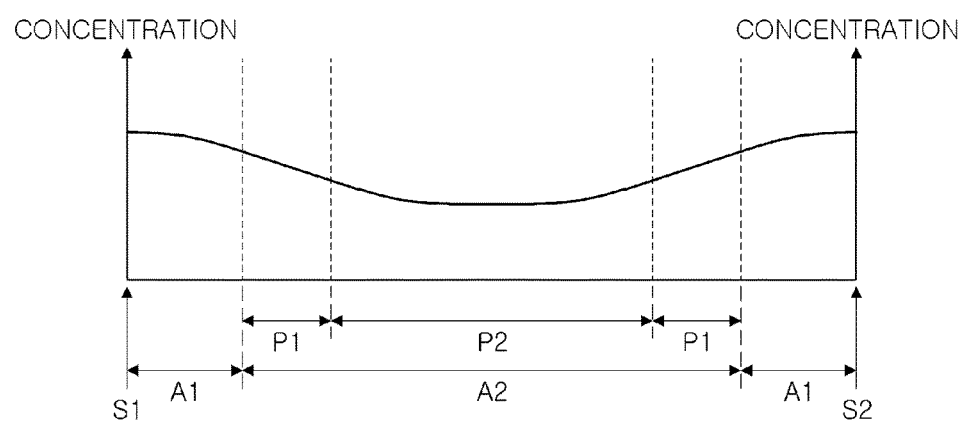

With reference to FIGS. 9A and 9B along with FIGS. 3 and 4, the interlayer insulating layers 109 may include a first interlayer insulating layer 109e_1 and a second interlayer insulating layer 109e_2, disposed adjacent to each other as vertically spaced apart from each other. In addition, a single horizontal conductive pattern 167e may be interposed between the first interlayer insulating layer 109e_1 and the second interlayer insulating layer 109e_2.

In the first interlayer insulating layer 109e_1 and the second interlayer insulating layer 109e_2, the impurity concentration may gradually decrease in a direction away from the first side surface S1 and the second side surface S2.

In an example, in the first interlayer insulating layer 109e_1 and the second interlayer insulating layer 109e_2, the impurity concentration may gradually decrease in a direction from the first side surface S1 and the second side surface S2 toward a central portion of the first interlayer insulating layer 109e_1 and the second interlayer insulating layer 109e_2.

In the first interlayer insulating layer 109e_1 and the second interlayer insulating layer 109e_2, the thickness may gradually increase in the direction from the first side surface S1 and the second side surface S2 toward the central portion of the first interlayer insulating layer 109e_1 and the second interlayer insulating layer 109e_2.

A thickness of the horizontal conductive pattern 167e may gradually decrease in a direction away from the first side surface S1 and the second side surface S2 of the first interlayer insulating layer 109e_1 and the second interlayer insulating layer 109e_2.

Figure 10A:
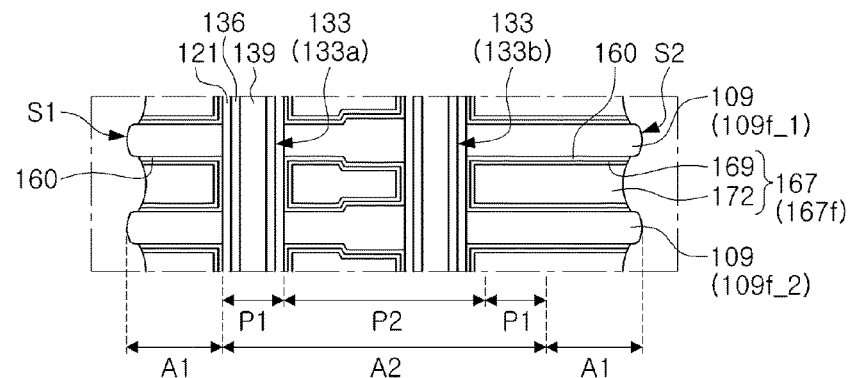
Figure 10B:
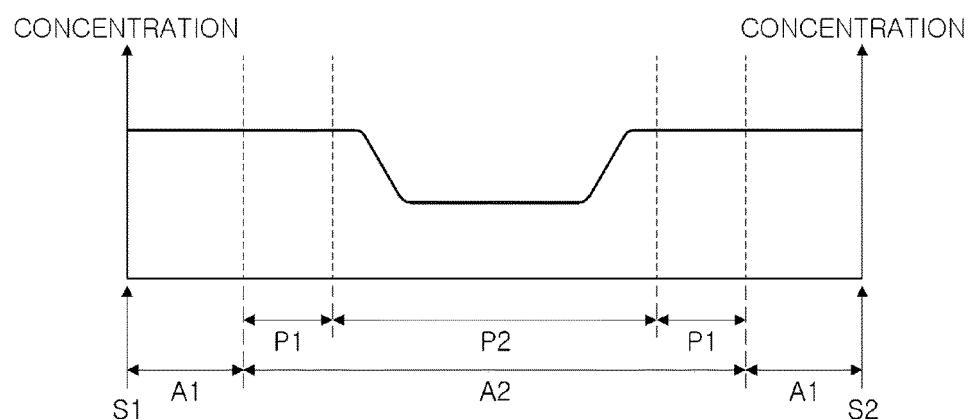

With reference to FIGS. 10A and 10B along with FIGS. 3 and 4, the interlayer insulating layers 109 may include a first interlayer insulating layer 109f_1 and a second interlayer insulating layer 109f_2, disposed adjacent to each other as vertically spaced apart from each other. In addition, a single horizontal conductive pattern 167f may be interposed between the first interlayer insulating layer 1090 and the second interlayer insulating layer 109f_2.

In the first interlayer insulating layer 109f_1 and the second interlayer insulating layer 109f_2, impurity concentrations in the first regions A1 and the first portions P1 of the second region A2 may be substantially uniform, while the impurity concentration may decrease in the second portion P2 of the second region A2.

In the second portion P2 of the second region A2 of the first interlayer insulating layer 109f_1 and the second interlayer insulating layer 109f_2, the step caused by a change in thickness may occur. A relatively thick portion of the second portion P2 of the second region A2 in the first interlayer insulating layer 1090 and the second interlayer insulating layer 109f_2 may have substantially the same thickness as that of the first region A1 and the first portions P1 of the second region A2. The relatively thick portion of the second portion P2 of the second region A2 in the first interlayer insulating layer 109f_1 and the second interlayer insulating layer 109f_2 may be disposed adjacent to the first portions P1 of the second region A2.

In a region of overlap between the horizontal conductive pattern 167f and the second portion P2 of the second region A2 of the first interlayer insulating layer 109f_1 and the second interlayer insulating layer 109f_2, the step between a thick portion and a thin portion may occur.

Figure 11A:
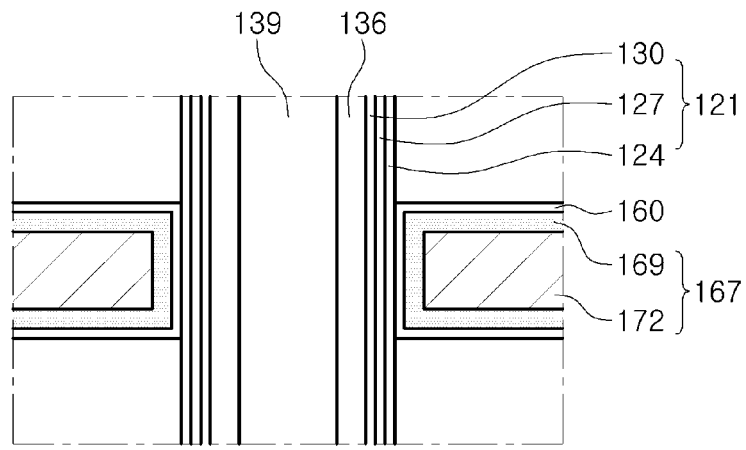
FIG. 11A is a cross-sectional view illustrating an example of a gate dielectric structure of a semiconductor device according to the present inventive concept.
Figure 11B:
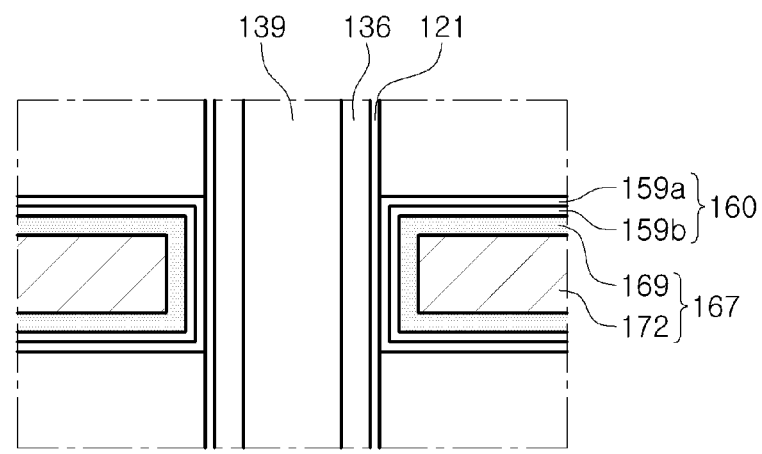
FIG. 11B is a cross-sectional view illustrating another example of a gate dielectric structure of a semiconductor device according to the present inventive concept.

FIGS. 11A and 11B are cross-sectional views illustrating examples of a gate dielectric structure including a first dielectric structure 121 and a second dielectric structure 160. In examples, one of the first dielectric structure 121 and the second dielectric structure 160 may include a data storage layer.

With reference to FIG. 11A along with FIGS. 3 and 4, the first dielectric structure 121 may include a data storage layer 127. For example, the first dielectric structure 121 may include a tunnel dielectric 130, the data storage layer 127, and a barrier dielectric 124.

The data storage layer 127 may be interposed between the tunnel dielectric 130 and the barrier dielectric 124. The tunnel dielectric 130 may be disposed adjacent to a semiconductor layer 136 of the vertical structures 133, while the barrier dielectric 124 may be disposed adjacent to the second dielectric structure 160.

The tunnel dielectric 130 may include silicon oxide and/or nitrogen-doped silicon oxide.

The data storage layer 127 may be provided as a layer to store information in a nonvolatile memory device, such as a flash memory device, or the like. For example, the data storage layer 127 may be provided as a charge trap layer to store information in such a manner that a charge is trapped.

The data storage layer 127 may include a material trapping and retaining an electron injected from the semiconductor layer 136 through the tunnel dielectric 130, or erasing the electron trapped in the data storage layer 127, depending on an operating condition of a memory device. For example, the data storage layer 127 may include silicon nitride. The barrier dielectric 124 may include a dielectric having an energy band gap greater than that of a high-k dielectric, e.g., silicon oxide.

The second dielectric structure 160 may include a blocking dielectric. For example, the second dielectric structure 160 may include the high-k dielectric, such as hafnium (Hf) oxide and/or aluminum (Al) oxide.

With reference to FIG. 11B along with FIGS. 3 and 4, the first dielectric structure 121 may include the tunnel dielectric, while the second dielectric structure 160 may include a data storage layer 159a and a blocking dielectric 159b. The data storage layer 159a may be interposed between the blocking dielectric 159b and the first dielectric structure 121. The data storage layer 159a may be provided as the charge trap layer.

Figure 12:
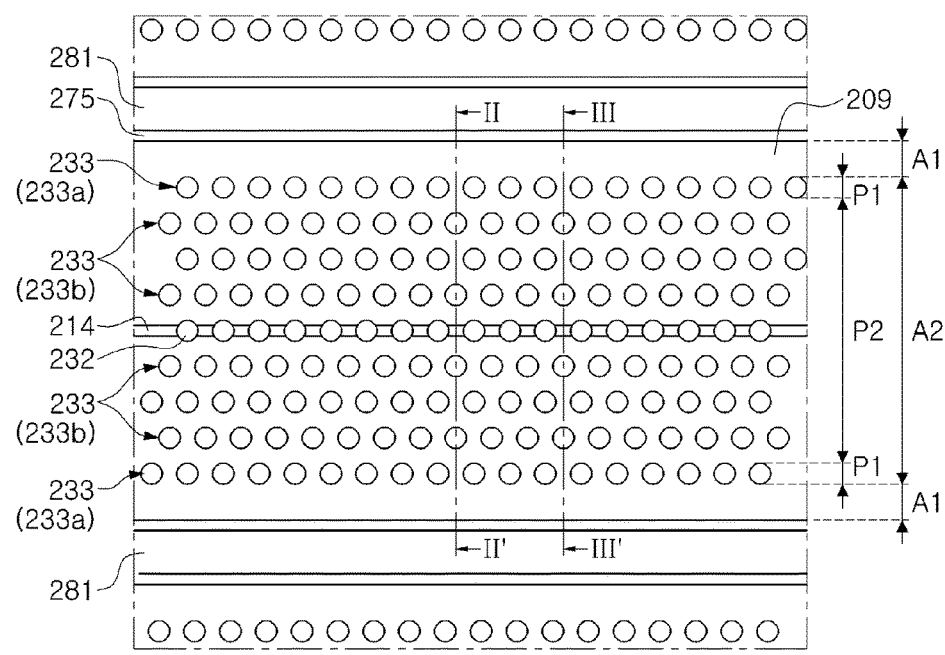
FIG. 12 is a plan view of an example of a semiconductor device according to the present inventive concept.

Another example of a semiconductor device according to the present inventive concept will be described with reference to FIGS. 12, 13A, and 13B. FIG. 12 is a plan view of the example, FIG. 13A is a cross-sectional view taken along line II-II' of FIG. 12, and FIG. 13B is a cross-sectional view taken along line III-III' of FIG. 12.

Figure 13A:
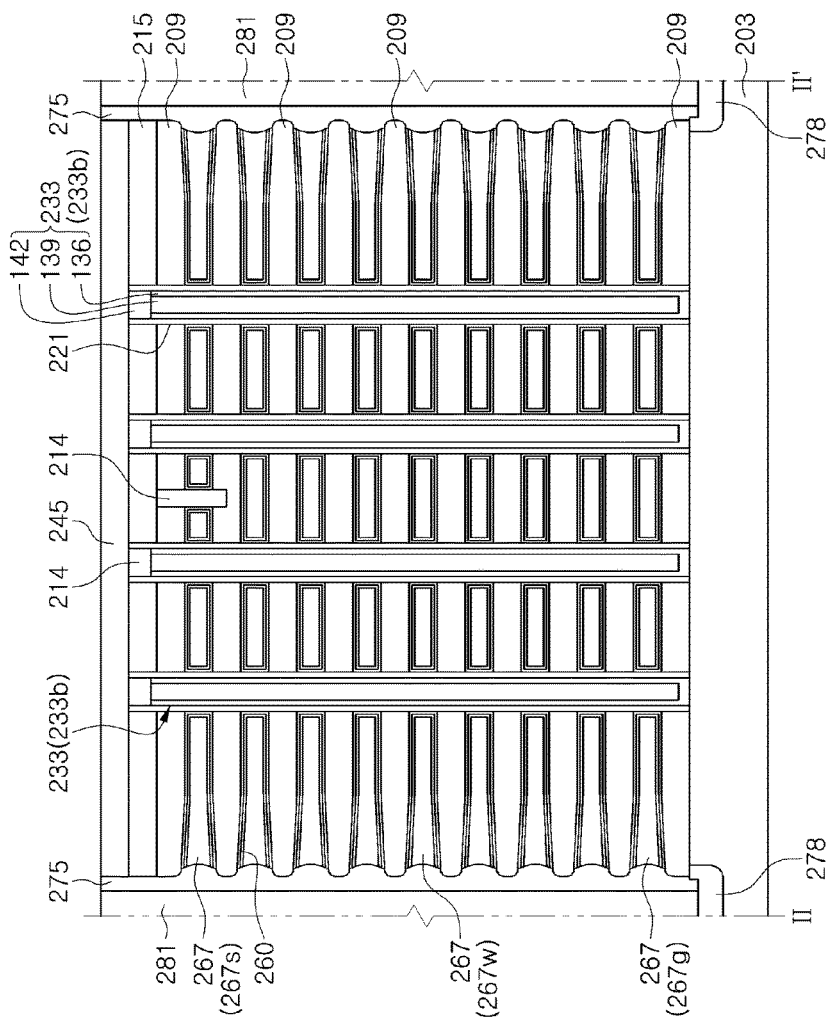
FIG. 13A is a cross-sectional view taken along line II-II' of FIG. 12.
Figure 13B:
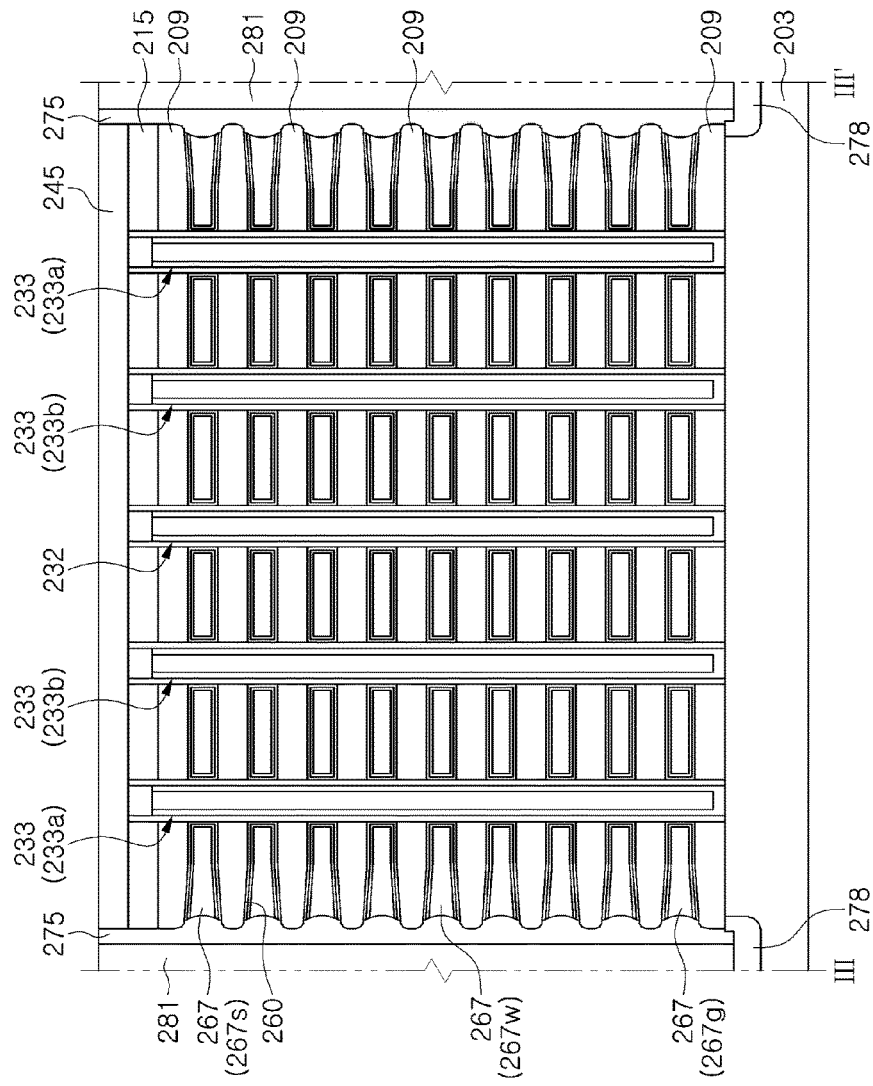
FIG. 13B is a cross-sectional view taken along line III-III' of FIG. 12.

With reference to FIGS. 12, 13A, and 13B, interlayer insulating layers 209 and horizontal conductive patterns 267 may be alternately stacked on a substrate 203.

A lowermost layer of the stack of the interlayer insulating layers 209 and the horizontal conductive patterns 267 may be an interlayer insulating layer 209. An uppermost layer of the stack may also be an interlayer insulating layer 209, with the uppermost and lowermost interlayer insulating layers 209 being of the same material as that of the intermediate interlayer insulating layers 209 in the stack. An uppermost pattern 267s of the horizontal conductive patterns 267 may be divided by an insulating string cut pattern 214, and may be provided as the SSL shown in and described with reference to FIG. 2. A lowermost pattern 267g of the horizontal conductive patterns 267 may be provided as the GSL shown in and described with reference to FIG. 2. Patterns 267w disposed between the uppermost pattern 267s and the lowermost pattern 267g may be provided as the WLs shown in and described with reference to FIG. 2.

The interlayer insulating layers 209 may be substantially the same as any of interlayer insulating layers 109 shown in and described with reference to FIGS. 5A, 6A, 7A, 8A, 9A, and 10A.

An uppermost interlayer insulating layer 215 may be disposed on the uppermost interlayer insulating layer 209. Vertical structures 233 extending through the uppermost interlayer insulating layer 215 and the interlayer insulating layers 209 may be formed. Dummy structures 232 may be disposed between the vertical structures 233. The dummy structures 232 may extend through the string cut pattern 214.

In an example, the vertical structures 233 and the dummy structures 232 may have the same structure.

In an example, the vertical structures 233 and the dummy structures 232 may have a structure the same as the vertical structures 133 shown in and described with reference to FIG. 3. For example, the vertical structures 233 and the dummy structures 232 may include a core pattern 139, a semiconductor layer 136 covering a bottom surface and a side surface of the core pattern 139, and a pad pattern 142 on the core pattern 139.

An impurity of a portion of the interlayer insulating layers 209, disposed adjacent to a portion of the dummy structures 232, may have a concentration lower than the impurity concentration of regions disposed adjacent to a side surface of the interlayer insulating layers 209. In this case, the impurity in the interlayer insulating layers 209 may be the same as that of the interlayer insulating layers 109 shown in and described with reference to FIGS. 3 and 4.

In addition, the impurity concentrations and the thicknesses of the interlayer insulating layers 209 and the horizontal conductive patterns 267 may be the same as the impurity concentrations and the thicknesses of the interlayer insulating layers 109 and horizontal conductive patterns 167, in any of the examples shown in and described with reference to FIGS. 5A to 10B.

An interlayer insulating layer 245 covering the vertical structures 233, the dummy structures 232, and the uppermost interlayer insulating layer 215 may be formed.

Separation patterns 281 spaced apart from each other may be disposed on the substrate 203. The separation patterns 281 may extend through the interlayer insulating layer 245, the uppermost interlayer insulating layer 215, the interlayer insulating layers 209, and the horizontal conductive patterns 267. The separation patterns 281 may have a line shape extending in a first direction (X direction) in a plan view. The interlayer insulating layers 209 and the horizontal conductive patterns 267 may be disposed between the separation patterns 281. In an example, the separation patterns 281 may include a conductive material, such as a metallic nitride (for example, TiN, TaN, or the like) and/or a metal (for example, Ti, W, or the like).

Insulating spacers 275 may be disposed on a side surface of the separation patterns 281. Source impurity regions 278 may be disposed in the substrate 203 beneath the separation patterns 281. The source impurity regions 278 may be provided as the CSL shown in and described with reference to FIG. 2.

Figure 14:
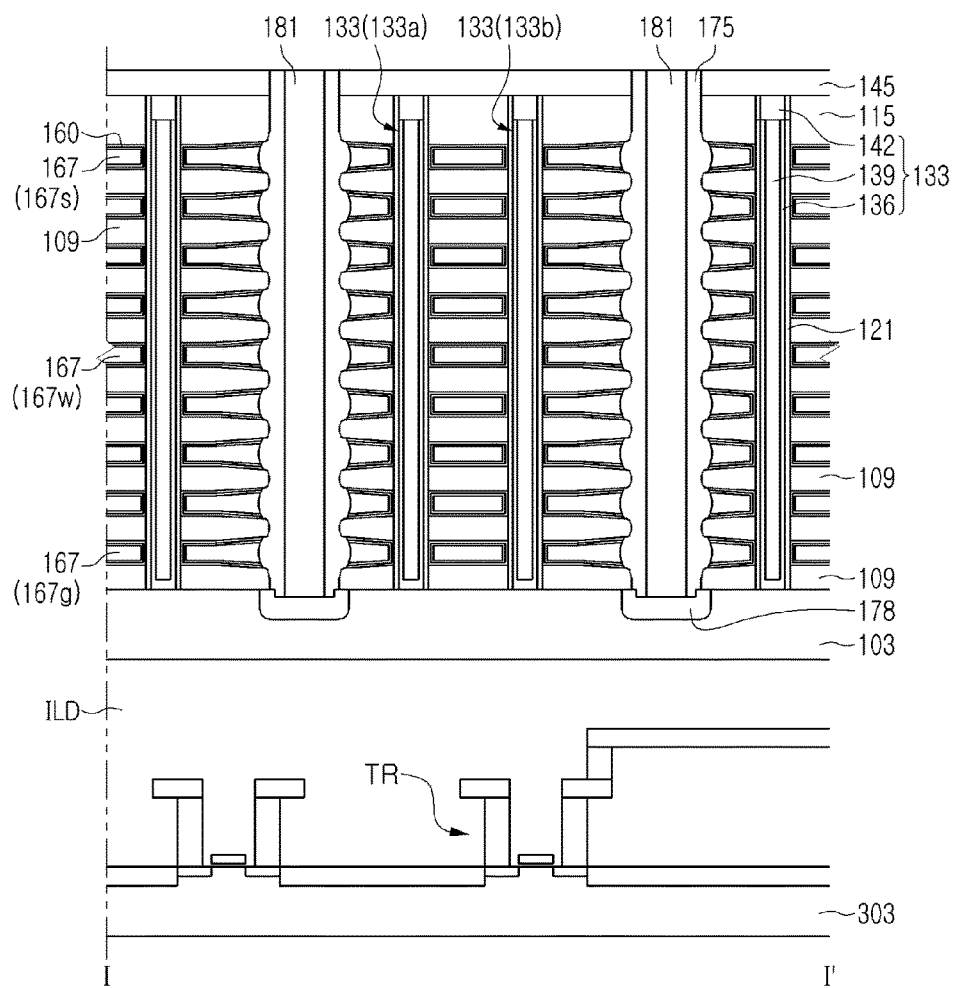
FIG. 14 is a cross-sectional view of still another example of a semiconductor device according to the present inventive concept.

Another example of a semiconductor device according to the present inventive concept will be described with reference to FIG. 14. FIG. 14 is a cross-sectional view of the example.

With reference to FIG. 14 and FIGS. 3 and 4, the substrate 103 and elements on the substrate 103 illustrated in FIGS. 3 and 4 may be disposed on a lower semiconductor substrate 303. An integrated circuit TR including discrete devices, such as a transistor, or the like, may be disposed on the lower semiconductor substrate 303. In addition, the integrated circuit TR may be covered by a lower interlayer insulating layer ILD disposed between the lower semiconductor substrate 303 and the substrate 103.

FIGS. 15 to 22 along with FIGS. 3 and 4 illustrate an example of a method of forming a semiconductor device according to the present inventive concept.

FIGS. 15 to 22 are cross-sectional views of a method of the semiconductor device during the course of its manufacture, as taken in the direction of line I-I' of FIG. 3.

Figure 15:
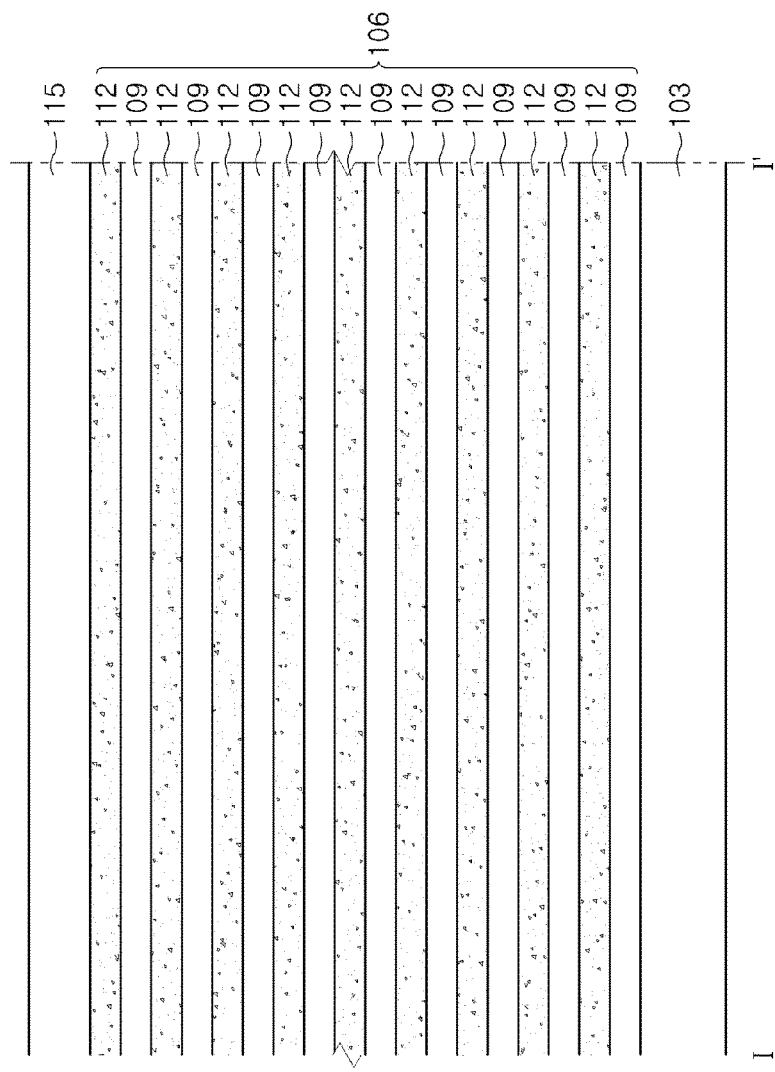
FIGS. 15, 16, 17, 18, 19, 20, 21 and 22 are cross-sectional views of an example of a semiconductor device during the course of its manufacture and together illustrate a method of forming a semiconductor device according to the present inventive concept.

With reference to FIGS. 3 and 15, interlayer insulating layers 109 and sacrificial layers 112, alternately stacked on a substrate 103 may be formed. The substrate 103 may be provided as a semiconductor substrate including a semiconductor material, such as Si or the like. The interlayer insulating layers 109 and the sacrificial layers 112 may constitute a stacked structure 106.

In an example, the interlayer insulating layers 109 may include silicon oxide.

In an example, the interlayer insulating layers 109 may include an oxide-based insulating material. For example, the interlayer insulating layers 109 may include silicon oxide including C.

The sacrificial layers 112 may include a material having a selective etching rate with respect to the interlayer insulating layers 109, such as a nitride-based material. For example, the sacrificial layers 112 may include silicon nitride.

An uppermost interlayer insulating layer 115 may be formed on the stacked structure 106. The uppermost interlayer insulating layer 115 may include a material the same as that of the interlayer insulating layers 109.

Figure 16:
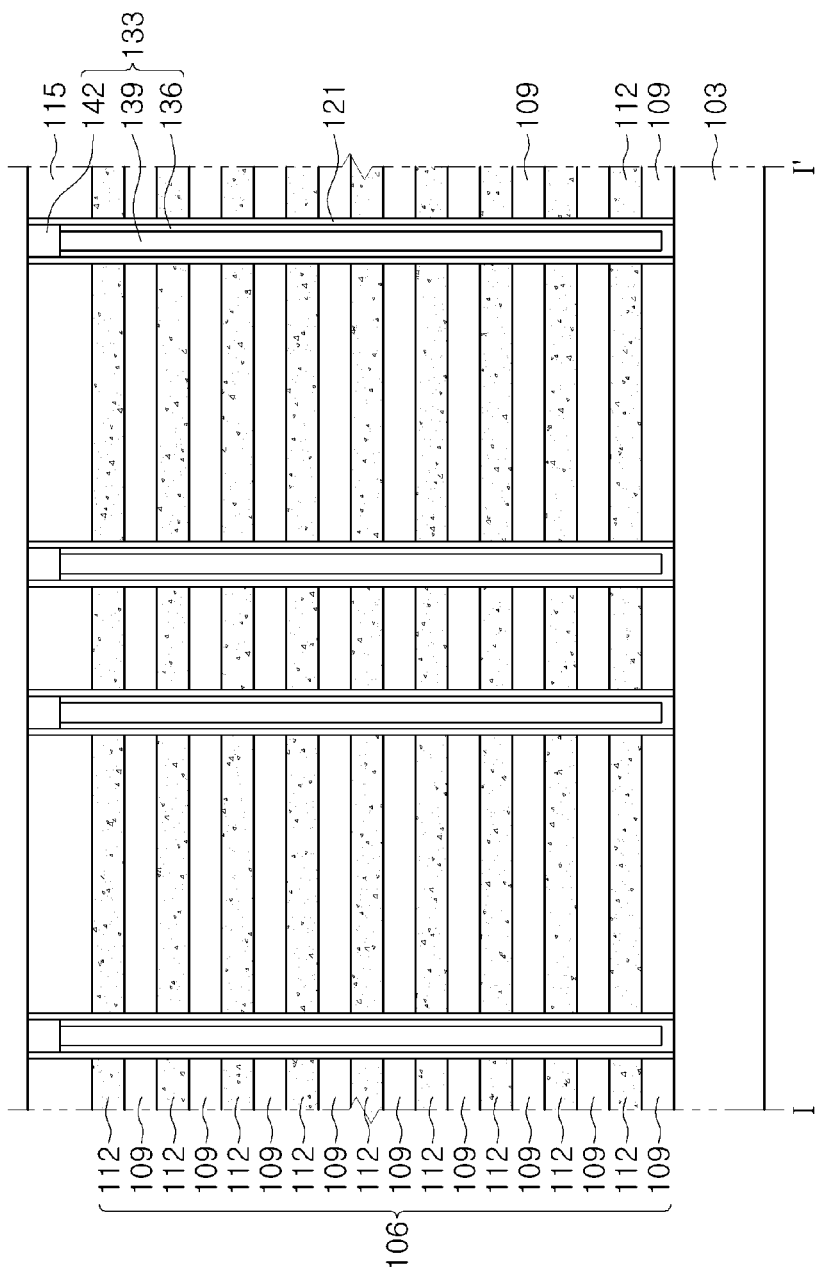

With reference to FIGS. 3 and 16, holes 118 may be formed through the uppermost interlayer insulating layer 115 and the stacked structure 106. First dielectric structures 121 may be formed on surfaces delimiting sides of the holes 118. Vertical structures 133 may be formed in the holes 118.

Forming the vertical structures 133 may include conformally forming a semiconductor layer 136 on the substrate 103 including the first dielectric structures 121, forming core patterns 139 partially filling the holes 118 on the semiconductor layer 136, forming a pad material layer on the substrate 103 including the core patterns 139, and forming pad patterns 142 by planarizing the pad material layer. The core patterns 139 may include a silicon oxide-based insulating material. The semiconductor layer 136 may include Si having semiconductor properties. The pad patterns 142 may include n-type doped Si.

Figure 17:
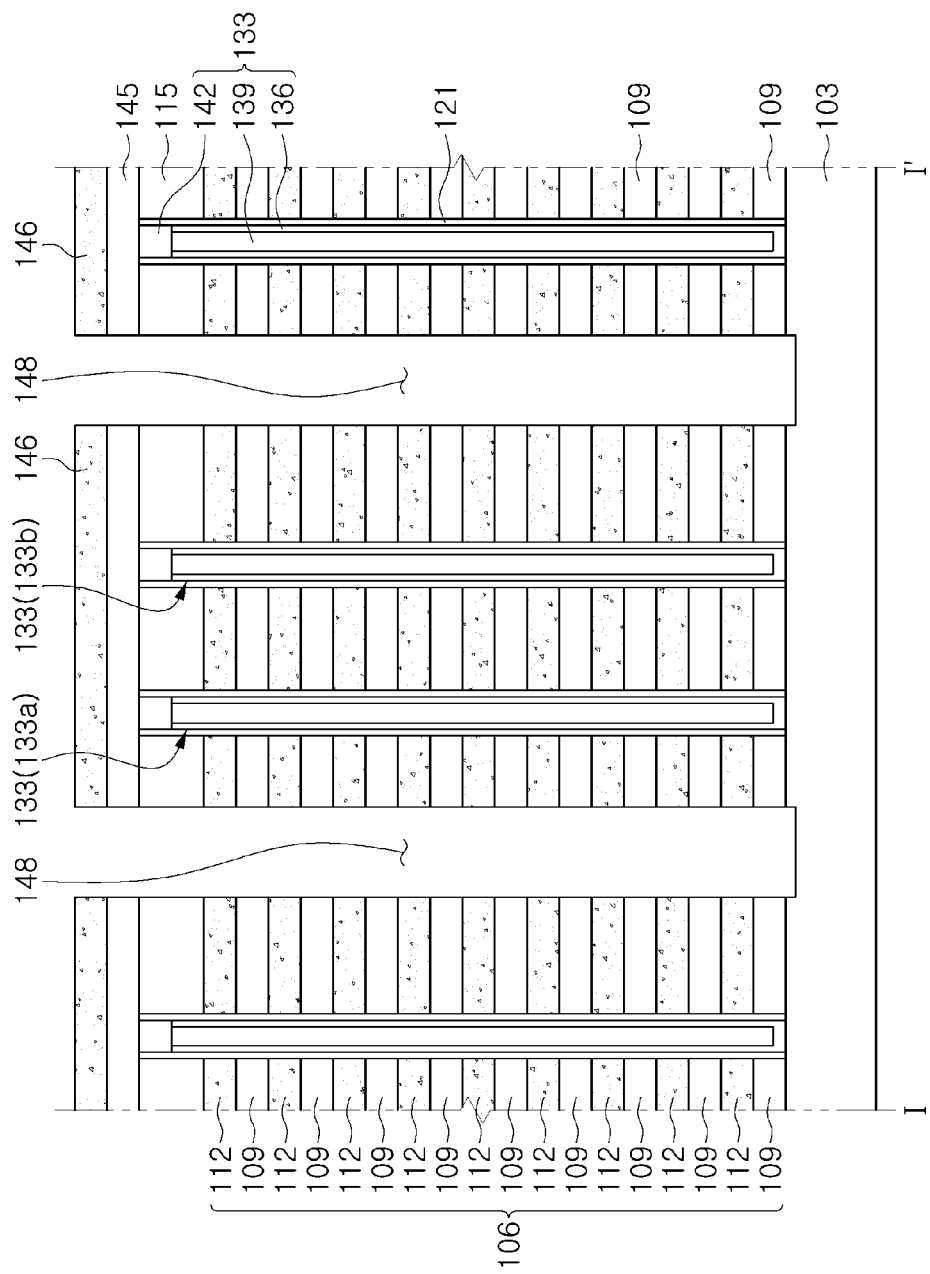

With reference to FIGS. 3 and 17, a capping layer 146 may be formed above the vertical structures 133 and on an uppermost insulating layer 145. The capping layer 146 may include a material harder than the interlayer insulating layers 109. For example, the capping layer 146 may include material harder than silicon oxide, such as silicon nitride.

Openings 148 extending through the capping layer 146, the uppermost insulating layer 145, and the stacked structure 106, and allowing the substrate 103 to be exposed may be formed. Side surfaces of the interlayer insulating layers 109 of the stacked structure 106 may be exposed by the openings 148.

Figure 18:
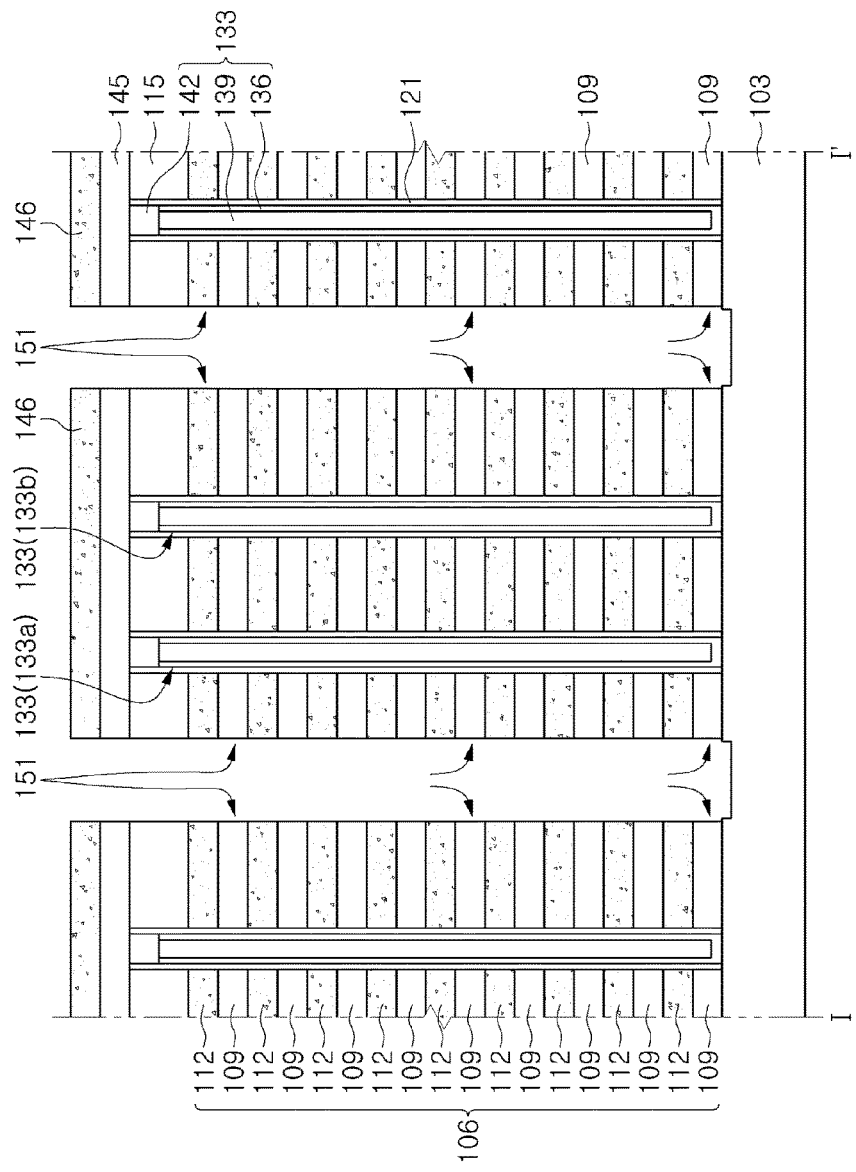

With reference to FIGS. 3 and 18, in an example, a diffusion process 151 for causing injecting an impurity into the interlayer insulating layers 109 and the uppermost interlayer insulating layer 115, and causing the impurity to diffuse some distance in the interlayer insulating layers 109 and the uppermost interlayer insulating layer 115, may be performed.

In an example, the sacrificial layers 112 and the capping layer 146 may be formed to be harder than the interlayer insulating layers 109 and the uppermost interlayer insulating layer 115. Therefore, during the diffusion process 151, a speed at which the impurity diffuses into the interlayer insulating layers 109 and the uppermost interlayer insulating layer 115 may be higher than the speed at which the impurity diffuses into the sacrificial layers 112 and the capping layer 146. The capping layer 146 may prevent the impurity from diffusing into the uppermost interlayer insulating layer 115 in a direction perpendicular to the substrate 103.

In an example, the impurity may diffuse into the interlayer insulating layers 109 and the uppermost interlayer insulating layer 115, and may accumulate at interfaces between the interlayer insulating layers 109 and the sacrificial layers 112 and at an interface between an uppermost one of the sacrificial layers 112 and the uppermost interlayer insulating layer 115. Therefore, the impurity concentration may be higher at the interfaces between the interlayer insulating layers 109 and the sacrificial layers 112 and at the interface between the uppermost sacrificial layer 112 and the uppermost interlayer insulating layer 115 than in the interlayer insulating layers 109 and the uppermost interlayer insulating layer 115.

The impurity may be atoms of an element found in the Periodic Table of Elements, effective at changing an etching rate of the interlayer insulating layers 109 and the uppermost interlayer insulating layer 115. For example, the impurity may be B, P, or the like, but the present inventive concept is not limited thereto. For example, the impurity of the interlayer insulating layers 109 may include N, H, Cl, F, or S.

In an example, impurity concentrations in the interlayer insulating layers 109 and the uppermost interlayer insulating layer 115 may be the same as the impurity concentration illustrated in FIG. 5B, but the present inventive concept is not limited thereto. For example, impurity concentrations in the interlayer insulating layers 109 and the uppermost interlayer insulating layer 115 may affect a process condition (for example, a process temperature, a process time, an amount of process source gas, and the like) of the diffusion process 151, to establish a certain distance over which the impurity will diffuse in a horizontal direction in the interlayer insulating layers 109 and the uppermost interlayer insulating layer 115. For example, impurity concentrations in the interlayer insulating layers 109 and the uppermost interlayer insulating layer 115 may have the same distribution as any of those illustrated in FIG. 6B, 7B, 8B, 9B, or 10B. The diffusion process 151 may include a thermal treatment process performed using thermal processing equipment operated at high temperature or may include a plasma doping process using a plasma generating apparatus.

In an example, the diffusion process 151 may include injecting an additional element into the interlayer insulating layers 109 and the uppermost interlayer insulating layer 115 before or after injecting the impurity into the interlayer insulating layers 109 and the uppermost interlayer insulating layer 115. The additional element may play a role in making the interlayer insulating layers 109 and the uppermost interlayer insulating layer 115 harder.

In an example, the additional element may be injected into the interlayer insulating layers 109 and the uppermost interlayer insulating layer 115 so as to be uniformly distributed therethrough. In addition, impurity concentrations in the interlayer insulating layers 109 and the uppermost interlayer insulating layer 115 may have the same distribution as any of those illustrated in FIG. 6B, 8B, or 10B. The impurity may be an element such as B or P, while the additional element may be an element such as C or the like.

In an example, the additional element (for example, C) may allow the interlayer insulating layers 109 to be formed in FIG. 15, and may be injected into the interlayer insulating layers 109 in-situ. The additional element may prevent a defect, such as the interlayer insulating layers 109 collapsing or being bent, from occurring.

Figure 19:
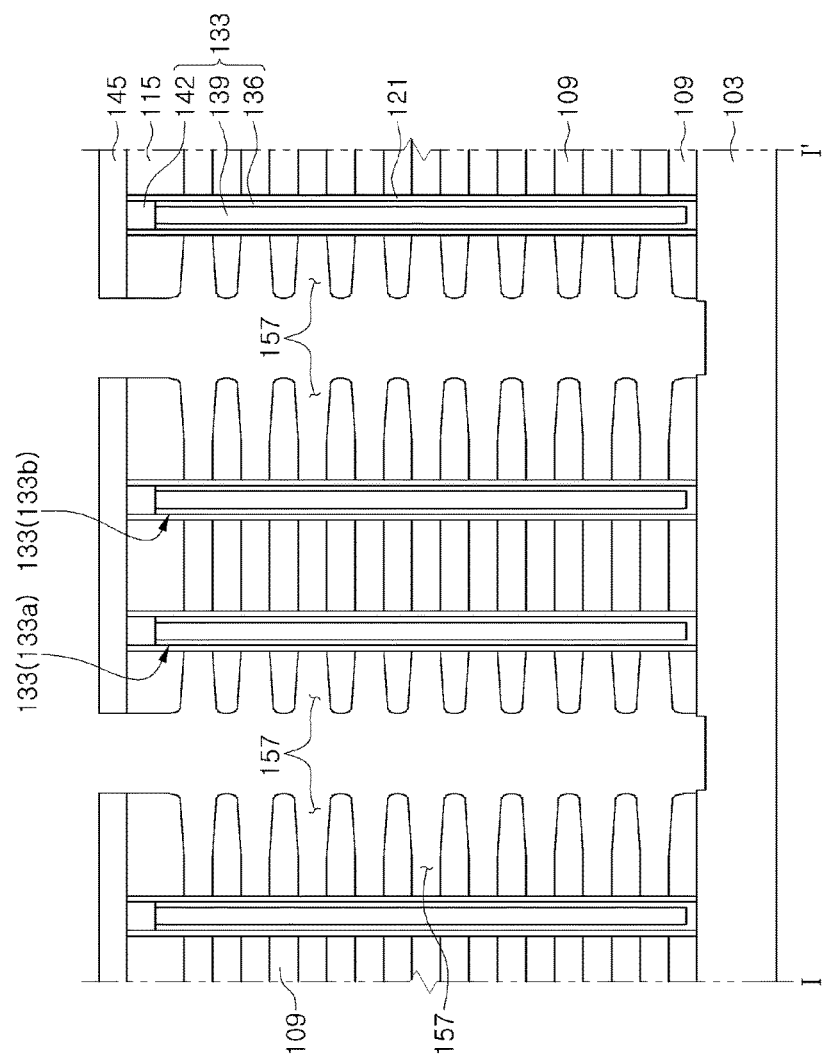

With reference to FIGS. 3 and 19, the sacrificial layers (112 in FIG. 18) may be removed, thus forming empty spaces 157. The sacrificial layers (112 in FIG. 18) may be removed using a wet etching process. For example, the sacrificial layers (112 in FIG. 18) may be removed using an etching solution such as diluted phosphoric acid or the like.

In an example, when the sacrificial layers (112 in FIG. 18) are removed, the capping layer (146 in FIG. 18) may be removed together therewith.

During an etching process for removing the sacrificial layers (112 in FIG. 18), a portion of the interlayer insulating layers 109 and the uppermost interlayer insulating layer 115 may be etched. For example, in the etching process for removing the sacrificial layers (112 in FIG. 18), a region having a relatively high impurity concentration may have a relatively high etching rate, while a region having a relatively low impurity concentration may have a relatively low etching rate in the interlayer insulating layers 109 and the uppermost interlayer insulating layer 115. Therefore, because a larger portion of the region having the relatively high impurity concentration may be etched away than that of the region having the relatively low impurity concentration, thicknesses of the interlayer insulating layers 109 and the uppermost interlayer insulating layer 115 may be significantly reduced. Therefore, depending on the impurity concentration of the interlayer insulating layers 109 and the uppermost interlayer insulating layer 115, the interlayer insulating layers 109 may have a varied thickness the same as any of those of the interlayer insulating layers 109 illustrated in FIG. 5A, 6A, 7A, 8A, 9A, or 10A.

Because regions of the interlayer insulating layers 109 disposed adjacent to the openings 148 may be relatively thin, an entrance of the empty spaces 157 disposed adjacent to the openings 148 may be relatively wide. In this respect, according to an aspect of the inventive concept, the size of the entrance of the empty spaces 157 may be increased using the etching process for removing the sacrificial layers (112 in FIG. 18), i.e., without a separate etching process for increasing the size of the entrance of the empty spaces 157.

In addition, etching damage to the first gate dielectric structure 121 may be significantly reduced or prevented by obviating the need for a separate etching process for increasing the size of the entrance of the empty spaces 157. Therefore, reliability thereof may be significantly improved.

Figure 20:
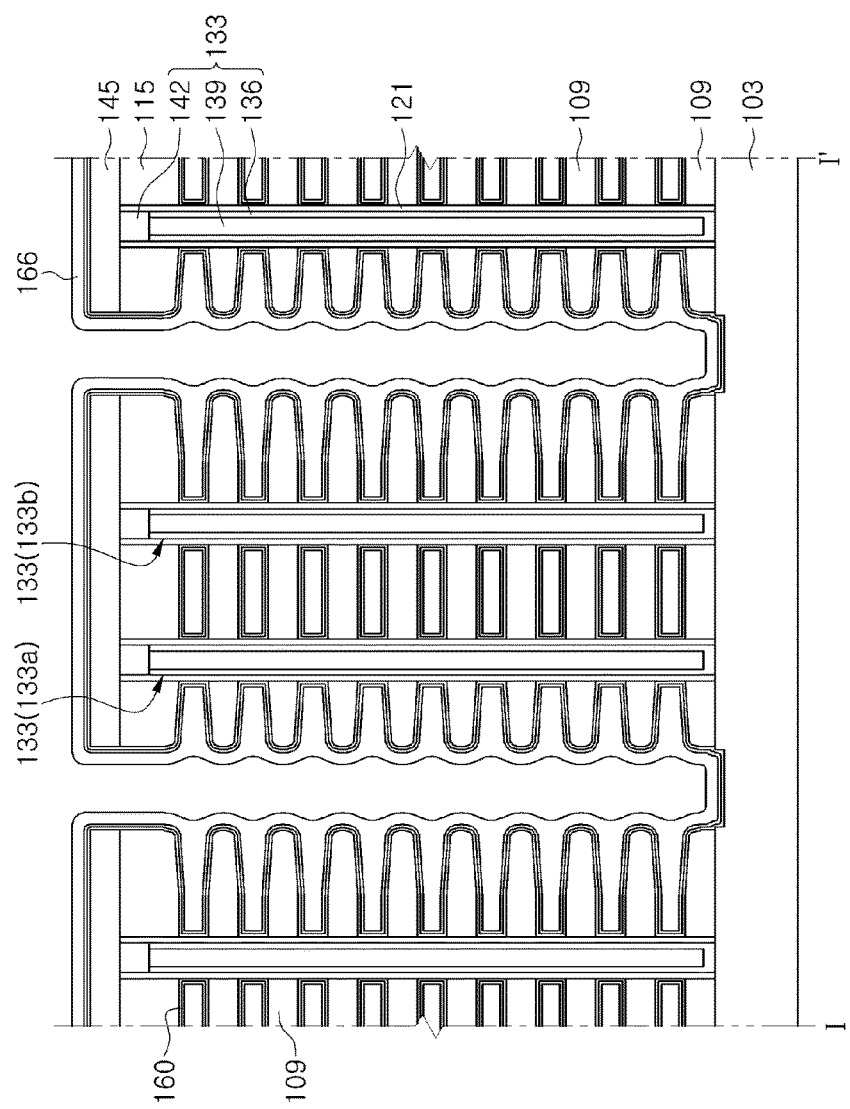

With reference to FIGS. 3 and 20, a second dielectric structure 160 may be conformally formed on the substrate 103 including the empty spaces 157. On the second dielectric structure 160, a horizontal conductive layer 166 filling the empty spaces 157 may be formed. The horizontal conductive layer 166 may be formed along sides and bottoms of the openings 148, and may not fill the entirety of the openings 148. The horizontal conductive layer 166 may include a metallic nitride layer (for example, a TiN layer) and a metal layer (for example, a W layer).

The first dielectric structure 121 and the second dielectric structure 160 may be formed as the gate dielectric structure shown in and described with reference to FIG. 11A or 11B.

Because the size of the entrance of the empty spaces 157 has been increased, the horizontal conductive layer 166 may be formed in the empty spaces 157 without a defect, such as a void or the like.

Figure 21:
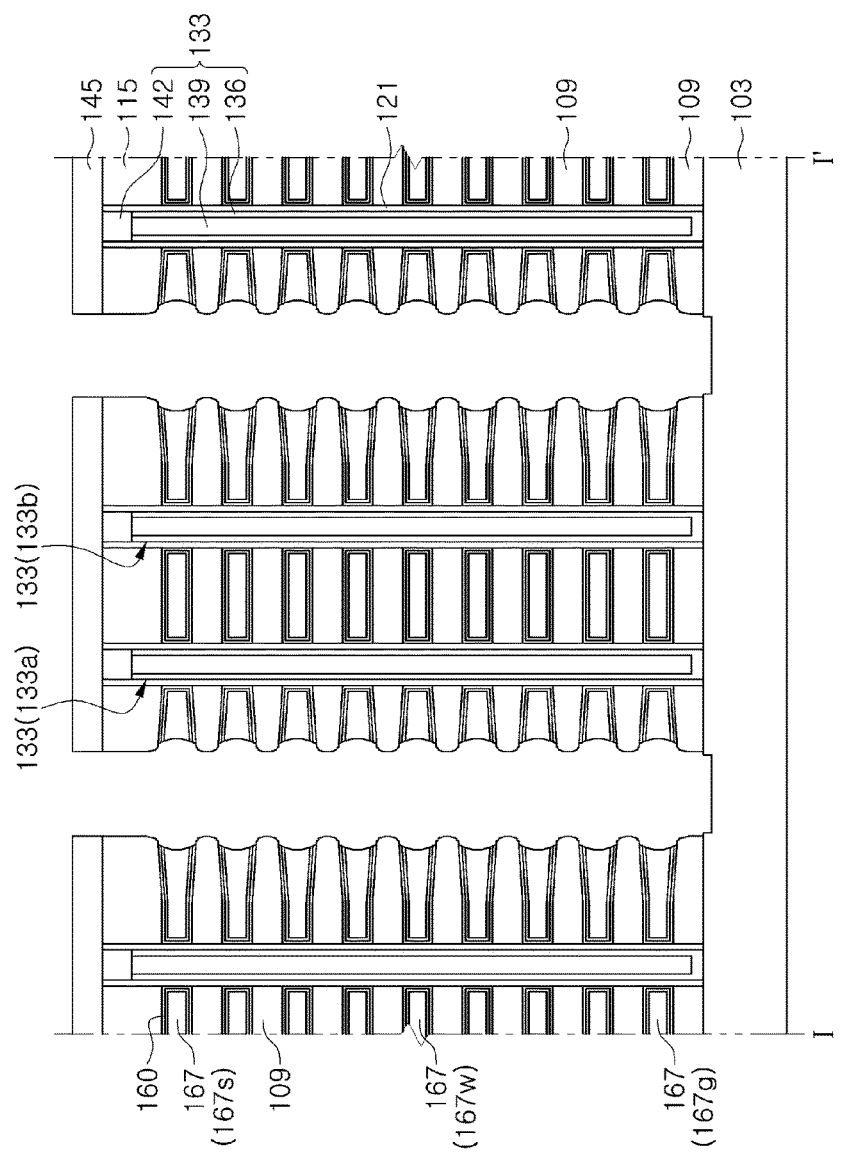

With reference to FIGS. 3 and 21, horizontal conductive patterns 167 may be formed by etching the horizontal conductive layer 166. The horizontal conductive patterns 167 may be formed to be narrower than the interlayer insulating layers 109.

Figure 22:
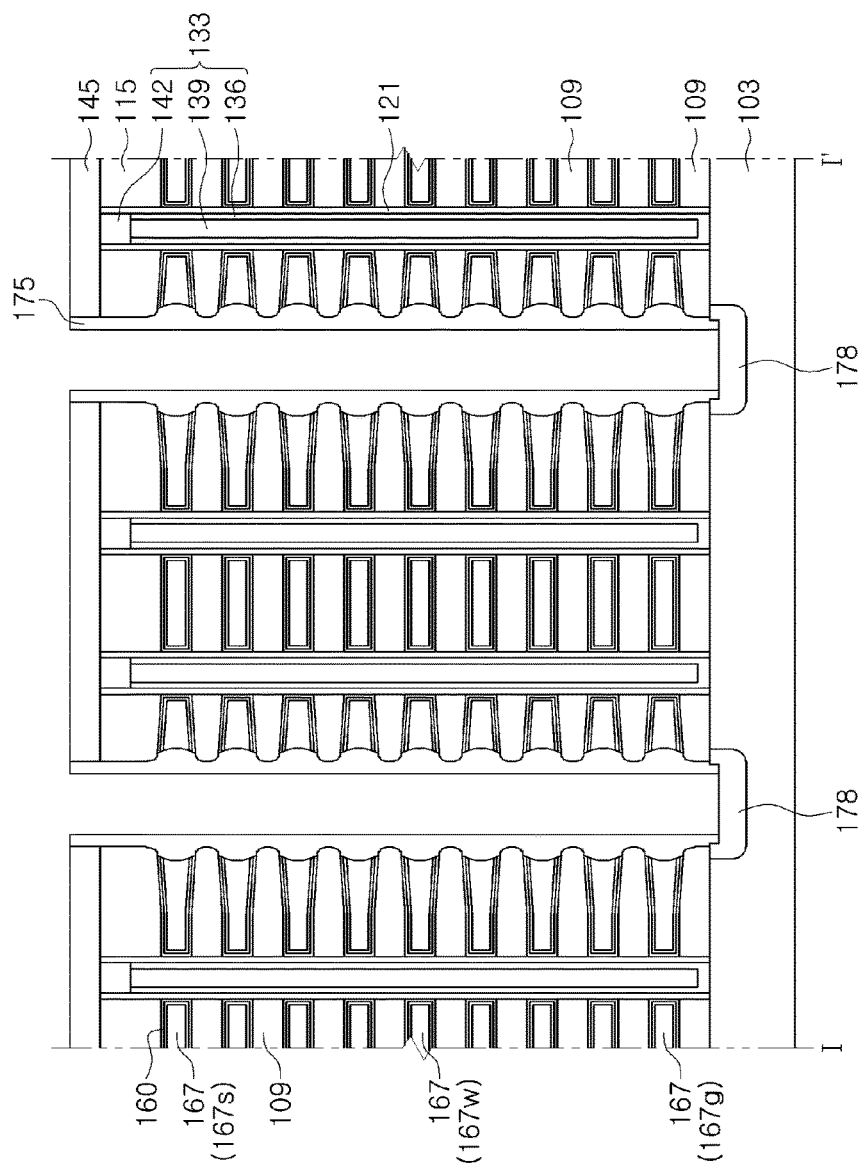

With reference to FIGS. 3 and 22, insulating spacers 175 may be formed on sides of the openings 148. The insulating spacers 175 may include an insulating material, such as silicon oxide or the like.

Source impurity regions 178 may be formed in the substrate 103 exposed by the openings 148 by performing an ion implantation process. The source impurity regions 178 may be formed to have n-type conductivity.

With reference to FIG. 4 along with FIG. 3, separation patterns 181 filling the openings 148 on the source impurity regions 178 may be formed. In an example, the separation patterns 181 may include a conductive material. For example, the separation patterns 181 may include metal silicide (for example, titanium silicide (TiSi), or the like), a metallic nitride (for example, TiN, or the like) and/or a metal (for example, W, or the like).

As described above, a method of forming a semiconductor device according to the present inventive concept may include forming a stacked structure including alternately stacked interlayer insulating layers and sacrificial layers on a substrate, forming vertical structures through the stacked structure, forming openings through the stacked structure, performing a diffusion process of diffusing an impurity into the interlayer insulating layers exposed by the openings, forming empty spaces by removing the sacrificial layers using an etching process, and forming horizontal conductive patterns in the empty spaces. A portion of the interlayer insulating layers is etched by the same etching process/etchant used to remove the sacrificial layers, i.e., at the same time that the sacrificial layers are being removed.

Also, according to examples of the present inventive concept, regions having different impurity concentrations, may be formed in the interlayer insulating layers. As such, in the interlayer insulating layers, the regions having different impurity concentrations, may have different etching rates. The method of forming a semiconductor device using the interlayer insulating layers may allow a defect rate to be reduced, and a decrease in the defect rate may lead to a yield and productivity being increased.

According to examples of the present inventive concept, the horizontal conductive patterns 167 used as a gate electrode or a word line may be interposed between the interlayer insulating layers 109 including the regions having different impurity concentrations. Regions A1 of the interlayer insulating layers 109 having the relatively high impurity concentration may be relatively thin. In addition, the horizontal conductive patterns 167 disposed between the regions A1 of the interlayer insulating layers 109, which are relatively thin, may be relatively thick. Therefore, electrical properties of the gate electrode or the word line may be increased, and thus electrical properties of the semiconductor device may be improved.

As described above, according to examples of the present inventive concept, regions having different impurity concentrations in interlayer insulating layers may be formed. As such, the regions having different impurity concentrations in the interlayer insulating layers may have different etching rates. A process of forming a semiconductor device using the interlayer insulating layers may allow a defect rate to be reduced, and a decrease in the defect rate may lead to a yield and productivity being increased.

Horizontal conductive patterns used as a gate electrode or a word line may be formed between the interlayer insulating layers including the regions having different impurity concentrations. A region having a relatively high impurity concentration in the interlayer insulating layers may be relatively thin. In addition, the horizontal conductive patterns disposed between regions of the interlayer insulating layers, which are relatively thin, may be relatively thick. Therefore, electrical properties of the gate electrode or the word line may be increased, and thus electrical properties of the semiconductor device may be improved.

Although examples have been shown and described above, it will be apparent to those skilled in the art that these examples may be modified or varied without departing from the scope of the present inventive concept as defined by the appended claims.

What is claimed is:

1. A semiconductor device, comprising:
   a first interlayer insulating layer and a second interlayer insulating layer;
   a horizontal conductive pattern interposed between the first interlayer insulating layer and the second interlayer insulating layer; and
   vertical structures each extending vertically through the first interlayer insulating layer, the second interlayer insulating layer, and the horizontal conductive pattern,
   wherein each of the first interlayer insulating layer and the second interlayer insulating layer has a first side surface and a second side surface facing in opposite directions with respect to each other, first regions disposed adjacent to the first side surface and the second side surface thereof, respectively, and a second region interposed between the first regions, and
   in each of the first interlayer insulating layer and the second interlayer insulating layer the first regions have an impurity concentration different from that of the second region such that in each of the first insulating layer and the second interlayer insulating layer the impurity concentration of is non-uniform along an axis parallel to the opposite directions.

2. The semiconductor device of claim 1, wherein in each of the first interlayer insulating layer and the second interlayer insulating layer, a portion of the second region has an impurity concentration lower than the impurity concentration of the first regions.

3. The semiconductor device of claim 1, wherein in each of the first interlayer insulating layer and the second interlayer insulating layer, a portion of the second region is thicker than the first regions.

4. The semiconductor device of claim 1, wherein the vertical structures comprise external vertical structures disposed adjacent to the first side surfaces and the second side surfaces of the first interlayer insulating layer and the second interlayer insulating layer, and internal vertical structures disposed further from the first side surfaces and the second side surfaces of the first interlayer insulating layer and the second interlayer insulating layer than the external vertical structures.

5. The semiconductor device of claim 4, wherein impurity concentrations of portions of the first interlayer insulating layer and the second interlayer insulating layer disposed adjacent to the internal vertical structures are lower than impurity concentrations of portions of the first interlayer insulating layer and the second interlayer insulating layer disposed adjacent to the first side surfaces and the second side surfaces of the first interlayer insulating layer and the second interlayer insulating layer.

6. The semiconductor device of claim 1, wherein the vertical structures comprise a first group of vertical channel structures disposed adjacent to the first side surface of each of the first and second interlayer insulating layers, a second group of vertical channel structures disposed adjacent to the second side surface of each of the first and second interlayer insulating layers, and vertical dummy structures disposed between the first and second groups of vertical channel structures, wherein the impurity concentrations of portions of the first interlayer insulating layer and the second interlayer insulating layer disposed adjacent to the vertical dummy structures are lower than the impurity concentration of portions of the first interlayer insulating layer and the second interlayer insulating layer disposed adjacent to the first side surface and the second side surface of each of the first interlayer insulating layer and the second interlayer insulating layer.

7. The semiconductor device of claim 1, further comprising a semiconductor substrate, wherein the first interlayer insulating layer, the second interlayer insulating layer, the horizontal conductive pattern, and the vertical structures are disposed on the semiconductor substrate.

8. The semiconductor device of claim 7, further comprising a gate dielectric structure disposed between the vertical structures and the horizontal conductive pattern, wherein the gate dielectric structure comprises a data storage layer.

9. The semiconductor device of claim 8, wherein the gate dielectric structure comprises a first dielectric structure and a second dielectric structure, the first dielectric structure has one portion interposed between the horizontal conductive pattern and the vertical structures and another portion extending between the first interlayer insulating layer and each of the vertical structures and between the second interlayer insulating layer and each of the vertical structures, the second dielectric structure has one portion interposed between the first dielectric structure and the horizontal conductive pattern and another portion extending between the first interlayer insulating layer and the horizontal conductive pattern and between the second interlayer insulating layer and the horizontal conductive pattern, and one of the first dielectric structure and the second dielectric structure comprises the data storage layer.

10. A semiconductor device, comprising:
interlayer insulating layers and horizontal conductive patterns alternately stacked on a substrate, each of the interlayer insulating layers having a first side surface and a second side surface facing in opposite directions with respect to each other;

vertical structures extending through the interlayer insulating layers and the horizontal conductive patterns; and data storage layers disposed between the vertical structures and the horizontal conductive patterns, wherein each of the interlayer insulating layers has first regions disposed adjacent to the first side surface and the second side surface thereof, respectively, and a second region interposed between the first regions, a portion of the second region is thicker than the first regions, and the first regions have an impurity concentration higher than that of the portion of the second region that is thicker than the first regions such that in each of the interlayer insulating layers the impurity concentration is non-uniform along an axis parallel to the opposite directions.

11. The semiconductor device of claim 10, wherein comparative etching rates of the first regions with the second region are such that the etching rate of the first regions is different from the etching rate of the portion of the second region that is thicker than the first regions.

12. The semiconductor device of claim 10, further comprising separation patterns disposed on the substrate as laterally spaced apart from each other, wherein the interlayer insulating layers and the horizontal conductive patterns are interposed between the separation patterns.

13. The semiconductor device of claim 12, further comprising insulating spacers on side surfaces of the separation patterns, wherein the insulating spacers have portions disposed between the separation patterns and the horizontal conductive patterns and extend from said portions between the separation patterns and the interlayer insulating layers.

14. The semiconductor device of claim 10, wherein the data storage layers are charge trap layers.

15. A semiconductor device, comprising:
a substrate;
separation structures disposed on the substrate and comprising insulating material;
a stack of horizontal layers disposed on the substrate and interposed between the insulating material of the separation structure, the horizontal layers including interlayer insulating layers and conductive lines alternately disposed in a vertical direction in the stack such that each of the conductive lines is interposed between vertically adjacent ones of a respective pair of the interlayer insulating layers;
vertical structures comprising semiconductor material extending through the stack of horizontal layers; and
wherein each of the conductive lines has a thickness, in the vertical direction, that varies in a widthwise direction of the conductive line between the separation structures, each of the conductive lines is thinnest at a central portion thereof intermediate the separation structures in the widthwise direction, and each of the interlayer insulating layers has first regions disposed adjacent to the separation structures, respectively, and a second region between the first regions, and the first regions have a thickness, in the vertical direction, that is less than a thickness of the second regions in the vertical direction, and the first regions and the second region have etch rates when exposed in common to a given etchant wherein the etch rate of the first regions is greater than that of the second region, and each of the interlayer insulating layers comprises a main body of material containing an impurity at a concentration that is non-uniform in widthwise direction of the interlayer insulating layer from one of the separation structures to the other of the separation structures.

16. The semiconductor device of claim 15, wherein a concentration of the impurity in each of the first regions, at locations where the first region borders the insulating material of a respective one of the separation structures, is different from a concentration of the impurity in the second region.

17. The semiconductor device of claim 15, wherein an array of the vertical structures extend through the second region of each of the interlayer insulating layers whereas the first regions are devoid of any vertical structures extending therethrough, the array has laterally outermost rows of the vertical structures extending through first portions of the second region of each of the interlayer insulating layers, respectively, and internal vertical structures extending through a second portion of the second region of each of the interlayer insulating layers, in each of the interlayer insulating layers, the second portion of the second region is interposed between the first portions of the second region, and in each of the interlayer insulating layers, a concentration of the impurity in each of the first portions of the second region is different from a concentration of the impurity in the second portion of the second region.

18. The semiconductor device of claim 17, wherein in each of the interlayer insulating layers, the concentration of the impurity in each of the first portions of the second region is uniform in the widthwise direction of the interlayer insulating layer from one of the separation structures to the other of the separation structures.

19. The semiconductor device of claim 17, wherein in each of the interlayer insulating layers, the concentration of the impurity in each of the first portions of the second region varies in the widthwise direction of the interlayer insulating layer from one of the separation structures to the other of the separation structures.

* * * * *